United States Patent
Kanesaka

[11] Patent Number: 6,100,598
[45] Date of Patent: Aug. 8, 2000

[54] SEALED SEMICONDUCTOR DEVICE WITH POSITIONAL DEVIATION BETWEEN UPPER AND LOWER MOLDS

[75] Inventor: Kenji Kanesaka, Tateyama, Japan

[73] Assignee: Nippon Steel Semiconductor Corporation, Tateyama, Japan

[21] Appl. No.: 09/034,405

[22] Filed: Mar. 4, 1998

[30] Foreign Application Priority Data

Mar. 6, 1997 [JP] Japan ..................................... 9-69149

[51] Int. Cl.[7] .................................................. H01L 23/28
[52] U.S. Cl. ......................... 257/787; 257/670; 257/666
[58] Field of Search ..................................... 257/787, 666, 257/670, 667

[56] References Cited

FOREIGN PATENT DOCUMENTS

| 28 19 287 | 11/1978 | Germany | 257/787 |
|---|---|---|---|
| 58-54659 | 3/1983 | Japan | 257/787 |
| 62-263666 | 11/1987 | Japan | 257/787 |
| 63-175453 | 7/1988 | Japan . | |
| 1-98251 | 4/1989 | Japan | 257/787 |
| 3-194956 | 8/1991 | Japan | 257/787 |

*Primary Examiner*—Sheila V. Clark
*Attorney, Agent, or Firm*—Pollock, Vande Sande & Amernick

[57] ABSTRACT

In a semiconductor device having a resin-encapsulated structure, the width of an upper-mold portion of a package in a direction parallel to inner leads is made smaller than that of a lower-mold portion of the package so that the upper-mold portion cannot extend further towards outer leads than the lower-mold portion. Therefore, the amount of the positional deviation between an actual package region and a prospective package region is small and tiebars can be arranged close to the prospective package region in a lead frame. Since a fixed distance is ensured between the tiebars and the actual package region after molding, damage to the package is prevented during tiebar cutting. Since the amount of extension of any resin burr is small, a deflashing step is omitted.

12 Claims, 16 Drawing Sheets

SEALED SEMICONDUCTOR DEVICE WITH POSITIONAL DEVIATION BETWEEN UPPER AND LOWER MOLDS

BACKGROUND OF THE INVENTION

1. Field of the Invention

The present invention relates to a resin-encapsulated semiconductor device in which a semiconductor element is encapsulated with a resin for the purpose of protecting the semiconductor element and, more particularly, to a technique suitably applicable to a resin-encapsulated LSI package having a structure in which leads are connected by tiebars.

2. Description of the Related Art

The forms of LSI packages are roughly classified into surface mounting type packages such as a BGA (Ball Grid Array) and a CSP (Chip Size Package) in which electrodes are arranged in the form of a grid on the entire surface of a substrate on which a semiconductor chip is mounted, and edge mounting type packages such as an SOP (Small Outline L-Leaded Package), a QFP (Quad Flat Package), and a TSOP (Thin Small Outline Package) in which electrodes are extracted from the edge of a semiconductor chip by using bonding wires and a lead frame. The former packages are used in some restricted logic products requiring an increase of the number of pins. That is, the latter edge mounting type packages are used in most LSI packages represented by a DRAM.

A general edge mounting type package will be described below.

FIG. 8 is a plan view showing an SOP as a representative edge mounting type package before resin encapsulation. The manufacturing process of this SOP will be described below with reference to FIG. 9.

First, the lower surface of a semiconductor chip 1 is bonded to the upper surface of a die pad 2 in a lead frame 12 including the die pad 2, inner leads 4, outer leads 5, and tiebars 8 (step S101). Bonding pads 13 formed on the semiconductor chip 1 are electrically connected to the inner leads 4 by bonding wires 3 (step S102).

Subsequently, the semiconductor chip 1 and the bonding wires 3 are encapsulated with an encapsulating resin 18 by transfer molding (step S103). The resin extending from the edge of the package is removed by punching by a resin cutting punch (step S104). The tiebars 8 in the lead frame 12 are cut to electrically separate the outer leads 5 (step S105).

Subsequently, the resin burr not removed by the resin cutting and the tiebar cutting is removed by water-jet (step S106), the outer leads 5 are cut from a base portion 14 (step S107), and the leads are plated with solder (step S108).

Finally, the leads are formed into a desired shape, thereby completing the SOP (step S109).

In the manufacturing process of this SOP, the deflashing step of removing the resin burr extending from the edge of the package is provided after the semiconductor chip 1 is encapsulated with the encapsulating resin 18. This extends the manufacturing period or increases the manufacturing cost. To eliminate this deflashing step, it is only necessary to prevent the resin from extending from the edge of the package. The easiest method of realizing this is to arrange the tiebars 8 close to a prospective resin encapsulation region 20. Ideally, it is desirable that the tiebars 8 are previously arranged along the prospective resin encapsulation region 20 in the lead frame 12.

In the manufacturing process of the SOP as described above, however, the position of the molding die for resin encapsulation may deviate from the prospective position on the basis of the lead frame 12 when the semiconductor chip 1 and the bonding wires 3 are encapsulated with the encapsulating resin 18 by transfer molding. Therefore, in consideration of the amount of this positional deviation, the positions of the tiebars 8 in the lead frame 12 must be determined. If such a positional deviation occurs when the tiebars 8 are arranged along the prospective resin encapsulation region 20, as shown in FIG. 10A, a tiebar cutting punch 9 punches not only the tiebar 8 but also the encapsulating resin 18 to break the package in tiebar cutting. In some cases, as shown in FIG. 10B, the tiebar 8 is partially resin-encapsulated and can not be cut.

Detailed steps in the molding step in which the semiconductor chip 1 and the bonding wires 3 are encapsulated with the encapsulating resin 18 by transfer molding will be described below in order to clarify the amount of the positional deviation between the prospective resin encapsulation region 20 and the actual region of the complete package.

FIGS. 11A to 11D are sectional views, taken along a line VI—VI in FIG. 8, showing steps in encapsulating the semiconductor chip 1 and the bonding wires 3 with the encapsulating resin 18 in order of steps.

First, as shown in FIG. 11A, the lead frame 12 on which the semiconductor chip 1 is mounted is placed on a lower mold 22 of a molding die for resin encapsulation. More specifically, the lead frame 12 and the lower mold 22 are matched by fitting positioning pins 23 of the lower mold 22 into sprocket holes 15 formed in the lead frame 12. The processing accuracy of the sprocket holes 15, the positioning pins 23, and the lower mold 22 is about a few $\mu$m. The positioning margin between the sprocket hole 15 and the positioning pin 23 is about 20 to 30 $\mu$m.

Subsequently, as shown in FIG. 11B, an upper mold 24 of the molding die for resin encapsulation is moved down from above the lead frame 12 to cover the lower mold 22 and the molding die is clamped. In this case, the upper and lower molds 24 and 22 are matched by fitting the positioning pins 23 of the lower mold 22 into positioning recesses 25 formed in the upper mold 24. That is, the positional relation between the upper mold 24 and the lead frame 12 are not directly determined. The processing accuracy of the upper mold 24 is about a few $\mu$m. The positioning margin between the positioning pin 23 and the positioning recess 25 is about 50 $\mu$m.

Subsequently, a resin is injected into a cavity of the molding die through an opening formed in the upper mold 24. Thereafter, as shown in FIG. 11C, the opening is closed with a plunger 26, and the encapsulating resin 18 is set in a pressure.

Finally, as shown in FIG. 11D, the upper and lower molds 24 and 22 and the plunger 26 are taken off the encapsulating resin 18, thereby finishing the molding.

In the conventional molding die for resin encapsulation, as shown in FIG. 11B, a width E101 of a cavity of the upper mold 24 of the molding die is made equal to a width E102 of a cavity of the lower mold 22 of the molding die. Therefore, when the upper and lower molds 24 and 22 are matched, there is a possibility that the positions of the upper and lower molds 24 and 22 deviate from the prospective resin encapsulation region 20 respectively. More specifically, after molding, the actual package region can horizontally deviate from the prospective package region on the basis of the lead frame 12 by about 100 $\mu$m which is equivalent to the sum of the processing accuracy of the components and the positioning margin described above.

Also, the length of the edge of the tiebar cutting punch 9 for cutting the tiebars 8, in a direction perpendicular to the tiebars 8 in a plane horizontal to the lead frame 12, is generally made larger by about 70 μm than the length of the tiebars 8 in the same direction in order to reliably cut the tiebars 8.

That is, in the stage of designing the lead frame, it is necessary to ensure a distance of at least about 170 μm between the tiebars 8 and the prospective resin encapsulation region 20.

When a package is manufactured by using the lead frame 12 in which the tiebars 8 are arranged at a distance of 170 μm from the prospective resin encapsulation region 20, the resin extends by about 170 μm at its longest from one side of the package to form resin burr. The amount of remaining resin burr on one side of the package is defined to be 150 μm or less in a dimension standardized by EIAJ, although it depends upon the type of product. Accordingly, even when the tiebars 8 are arranged closest to the prospective resin encapsulation region 20, removal of resin burr must be performed after tiebar cutting in the conventional methods.

SUMMARY OF THE INVENTION

In a resin-encapsulated semiconductor device in which a semiconductor element is encapsulated with a resin and, more particularly, in a resin-encapsulated LSI package having a structure in which leads are connected by tiebars, it is an object of the present invention to simplify the manufacturing process of the LSI package by eliminating a step of removing resin burr.

In a resin-encapsulated semiconductor device in which a semiconductor element is encapsulated with a resin and, more particularly, in a resin-encapsulated LSI package having a structure in which leads are connected by tiebars, it is another object of the present invention to provide an LSI package having a structure in which, even when tiebars are previously arranged close to a prospective resin encapsulation region in a lead frame, a fixed distance or more is constantly maintained between the tiebars and the package in order to prevent damage to the package during tiebar cutting.

In a resin-encapsulated semiconductor device in which a semiconductor element is encapsulated with a resin and, more particularly, in a resin-encapsulated LSI package having a structure in which leads are connected to a peripheral portion of a semiconductor element, it is still another object of the present invention to provide an LSI package having a structure in which the end portion of an upper-mold portion of a package does not extend toward outer leads longer than the end portion of a lower-mold portion of the package.

According to an aspect of the present invetion there is provided a semiconductor device comprising a semiconductor chip, a mold portion for encapsulating the semiconductor chip, and inner leads extending substantially parallel to a circuit formation surface of the semiconductor chip in the mold portion and protruding outward from side surfaces of the mold portion, wherein the mold portion comprises an upper-mold portion covering the circuit formation surface of the semiconductor chip and a lower-mold portion covering an opposite surface of the semiconductor chip, and a width of the upper-mold portion is smaller than a width in the same direction of the lower-mold portion.

Accordingly, even if the position of a molding die deviates in molding, it is possible to prevent the upper-mold portion which is made smaller than the lower-mold protion from extending longer toward the outer leads than the lower-mold portion.

Preferably, the mold portion has a substantially rectangular shape, and an end face of the upper-mold portion is offset by a distance greater than 0 μm and not greater than 50 μm from an end face of the lower-mold portion on at least one side surface of the mold portion.

Preferably, at least one of outer leads connected to the inner leads has at least one of a projection and a recess formed outside an end face of the lower-mold portion when tiebars, connecting the outer leads which are arranged in parallel with one another, are cut.

Preferably, the mold portion has a substantially rectangular shape, and the width of the upper-mold portion is smaller than the width in the same direction of the lower-mold portion on two pairs of side surfaces constituting four side surfaces of the mold portion.

According to another aspect of the present invetion, there is provided a semiconductor device in which a semiconductor chip is encapsulated with a resin comprising inner leads arranged on a peripheral portion of the semiconductor chip, the inner leads extending parallel to a circuit formation surface of the semiconductor chip and protruding outward from side surfaces of a mold portion, wherein a distance R1 from an end portion of the mold portion on a surface on which a bonding wire is bonded of at least one of the inner leads to an end portion of an outer lead connected to the inner lead is not less than a distance R2 from the end portion of the mold portion on an opposite surface of the inner lead to the end portion of the outer lead.

Preferably, a difference between the distances R1 and R2 is greater than 0 μm and not greater than 50 μm.

According to still another aspect of the present invetion, there is provided a semiconductor device comprising a semiconductor chip, a mold portion for encapsulating the semiconductor chip, and inner leads extending substantially parallel to a circuit formation surface of the semiconductor chip in the mold portion and protruding outward from side surfaces of the mold portion, wherein the mold portion comprises an upper-mold portion covering the circuit formation surface of the semiconductor chip and a lower-mold portion covering an opposite surface of the semiconductor chip, and a width of the upper-mold portion is larger than a width in the same direction of the lower-mold portion.

According to still another aspect of the present invetion, there is provided a resin-encapsulated semiconductor device in which a semiconductor chip is encapsulated with a resin comprising inner leads arranged on a peripheral portion of the semiconductor chip, the inner leads extending parallel to a circuit formation surface of the semiconductor chip and protruding outward from side surfaces of a mold portion. A distance R3 from an end portion of the mold portion on a surface on which a bonding wire is bonded of at least one of the inner leads to an end portion of an outer lead connected to the inner lead is not more than a distance R4 from the end portion of the mold portion on an opposite surface of the inner lead to the end portion of the outer lead.

According to still another aspect of the present invetion, there is provided a semiconductor device comprising a semiconductor chip, a mold portion for encapsulating the semiconductor chip, inner leads extending on a plane substantially horizontal to a surface of the semiconductor chip, an end portion of each of the inner leads arranged near the semiconductor chip in the mold portion and the other end portion of each of the inner leads protruding outward from side surfaces of the mold portion. A portion of the mold portion on the upper side of the plane on which the inner leads are extending is defined as an upper-mold portion and a portion of the mold portion on the lower side of the plane on which the inner leads are extending is defined as a lower-mold portion, and a maximum length of the upper-mold portion in at least one direction parallel to the inner leads is different from a maximum length of the lower-mold portion in the same direction.

In the present invention, one mold portion of a package on one side of a semiconductor chip is made smaller than the other mold portion of the package on the other side of the semiconductor chip. Therefore, the amount of the positional deviation between a complete package region and a prospective package region on a lead frame can be decreased. Accordingly, even when tiebars are arranged close to a prospective resin encapsulation region in the stage of designing a lead frame, a fixed distance is ensured constantly between the tiebars and the mold portion after molding. Consequently, it is possible to prevent damage to the package during tiebar cutting and to manufacture semiconductor devices with a stable yield. Furthermore, since the tiebars and the prospective resin encapsulation region are arranged close to each other, the amount of extension of resin burr can also be reduced. Consequently, a deflashing step is omitted, and this enables a shortening of the process and a reduction of the cost.

DETAILED DESCRIPTION OF THE PREFERRED EMBODIMENTS

Several embodiments of a resin-encapsulated semiconductor device according to the present invention and a method of manufacturing the same will be described in detail below with reference to the accompanying drawings.

First Embodiment

The first embodiment will be described below.

Figure 1A:
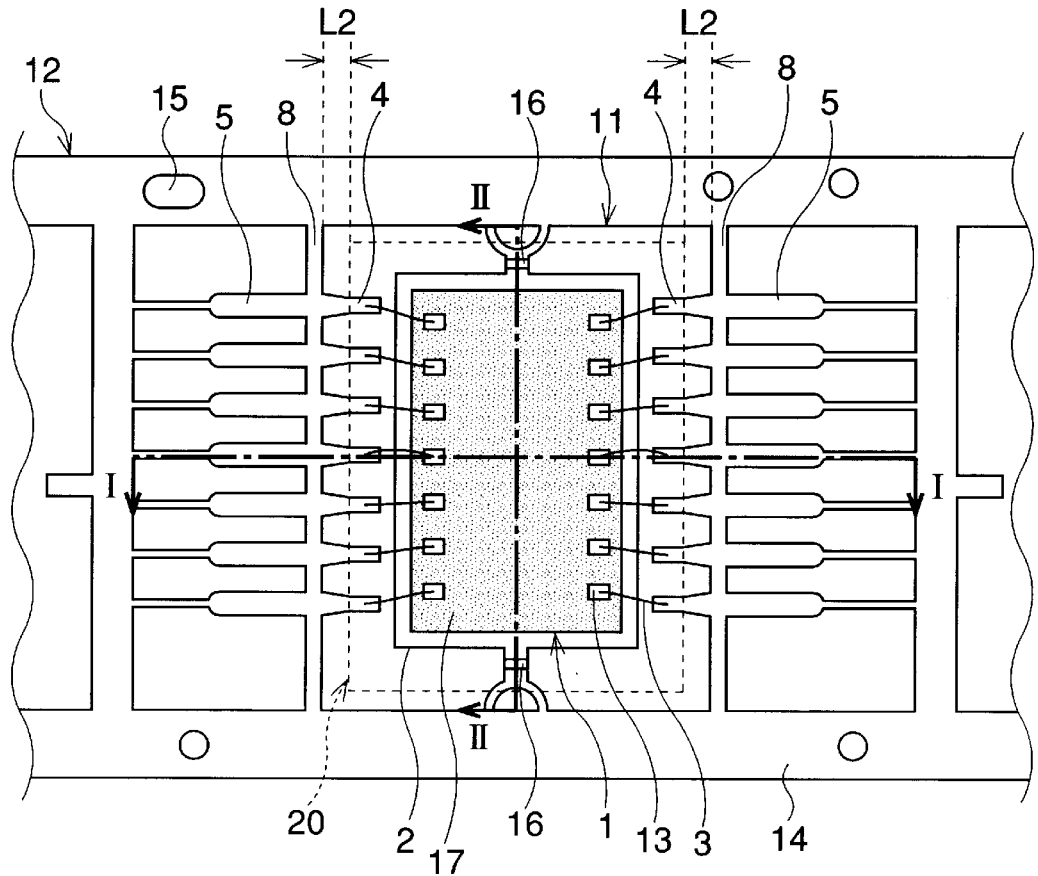
FIG. 1A is a schematic plan view showing a resin-encapsulated semiconductor device of the present invention before resin encapsulation.
Figure 1B:
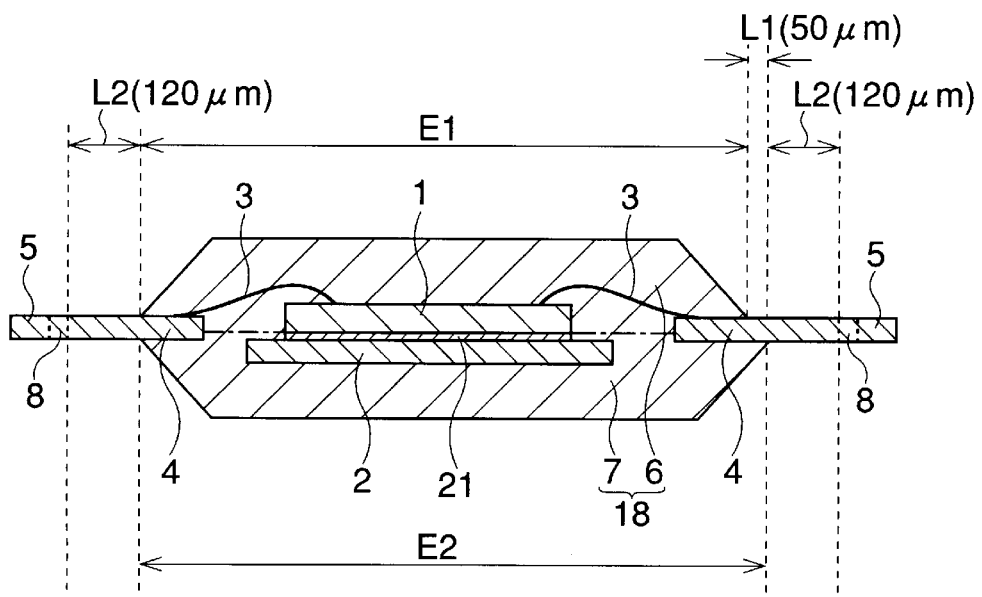
FIG. 1B is a schematic sectional view, taken along a line I—I in FIG. 1A, showing the semiconductor device after resin encapsulation.
Figure 1C:
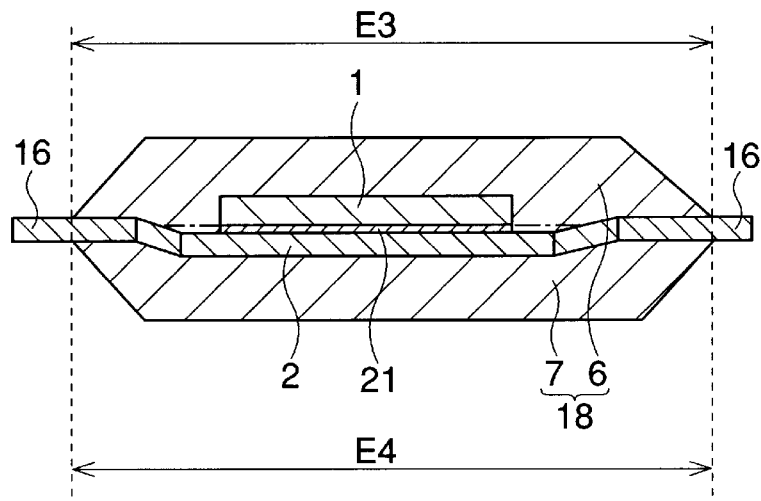
FIG. 1C is a schematic sectional view, taken along a line II—II in FIG. 1A, showing the semiconductor device after resin encapsulation.

First, the schematic arrangement of a semiconductor device according to the first embodiment will be described. FIG. 1A is a plan view schematically showing the semiconductor device of the first embodiment before resin encapsulation. FIG. 1B is a sectional view taken along a line I—I in FIG. 1A after resin encapsulation and before tiebar cutting. FIG. 1C is a sectional view taken along the line II—II in FIG. 1A after resin encapsulation and before tiebar cutting.

The semiconductor device of the first embodiment shown in FIG. 1A includes a semiconductor chip 1 on which semiconductor elements (in this embodiment, a DRAM is exemplified as the semiconductor elements) are formed, and a lead frame 12 fixed to the semiconductor chip 1.

On the semiconductor chip 1, a plurality of memory cells (memory cell regions) each having at least one transistor and capacitor are formed in a matrix, and a plurality of peripheral circuits (peripheral circuit regions) for the memory cells are formed around the memory cells. On the surface of the semiconductor chip 1, a protective film 17 for protecting the memory cell regions and the peripheral circuit regions from α-rays is formed so as to cover these circuits. A plurality of openings are formed in the protective film 17 so as to partially expose the surface of the semiconductor chip 1. A bonding pad 13 made of a conductive material and electrically conducted to predetermined portion of the semiconductor chip 1 is formed in each of the openings.

A rectangular device hole 11 is formed in a substantially central portion of the lead frame 12 made of an alloy. The lead frame 12 having the device hole 11 includes inner leads 4, outer leads 5, tiebars 8, a base portion 14, and sprocket holes 15. The inner leads 4 are formed so as to substantially symmetrically project from the opposing two sides of the peripheral edge of the device hole 11 toward the device hole 11. Each of the outer leads 5 is connected to the corresponding inner lead 4. Each of the tiebars 8 is formed so as to cross the boundary portions between the inner leads 4 and the outer leads 5. The base portion 14 supports the tiebars 8. The sprocket holes 15 are formed in the base portion 14 at a predetermined interval. The distance L2 between the tiebars 8 and a prospective resin encapsulation region 20 as a package region is 120 μm, which is conventionally 170 μm.

In the device hole 11, a pair of suspension pins 16 are formed in the lead frame 12 on the two sides of the peripheral edge of the device hole 11 on which the inner leads 4 are not formed. The end portions of these suspension pins 16 are offset downward from the level of the lead frame 12 by about the thickness of the semiconductor chip 1. A die pad 2 for holding the semiconductor chip 1 is formed in the device hole 11 and fixed to the lead frame 12 by the suspension pins 16. A plurality of lead frames 12 are continuously formed so as to correspond to a plurality of semiconductor chips 1. FIG. 1A shows one lead frame 12 corresponding to one semiconductor chip 1. The thickness of the lead frame 12 is normally about 0.125 mm.

The semiconductor chip 1 is fixed on the die pad 2 with a cushioning material 21 interposed therebetween. The inner leads 4 are electrically connected to the bonding pads 13 formed in arbitrary positions on the semiconductor chip 1 by bonding wires 3 made of gold (Au). The bonding wire 3 may be a copper (Cu) wire, a coated wire formed by coating the surface of a metal wire with an insulating resin, or the like.

The outer leads 5 connected to the inner leads 4 and separated from one another by cutting the tiebars 8 are used as a power terminal for supplying a power supply voltage to each circuit constituting a DRAM, a data signal input terminal, a write enable terminal, a row address strobe signal terminal, a column address strobe signal terminal, a data signal output terminal, a reference voltage terminal, a free terminal, and the like.

The prospective resin encapsulation region 20 shown in FIG. 1A is filled with a resin by using a molding die, and all surfaces of the semiconductor chip 1 are covered with an encapsulating resin 18 having almost rectangular parallelepiped shape as shown in FIGS. 1B and 1C. Assuming that a portion of the encapsulating resin 18 on one side of the semiconductor chip 1 on which the bonding wires 3 pass is an upper-mold portion 6 and a portion of the encapsulating resin 18 on the other side of the semiconductor chip 1 close to the die pad 2 is a lower-mold portion 7, a distance E1 from the boundary of the inner leads 4 at one end to the boundary of the inner leads 4 at the other end in the upper-mold portion 6 is shorter by L1 than a distance E2 from the boundary of the inner leads 4 at one end to the boundary of the inner leads 4 at the other end in the lower-mold portion 7. This distance L1 is set to a value equivalent to the amount of the positional deviation occurring when the upper and lower molds of the molding die are matched to encapsulate the semiconductor chip 1 with the resin. For example, L1 is set to about 50 μm in this embodiment.

Figure 2:
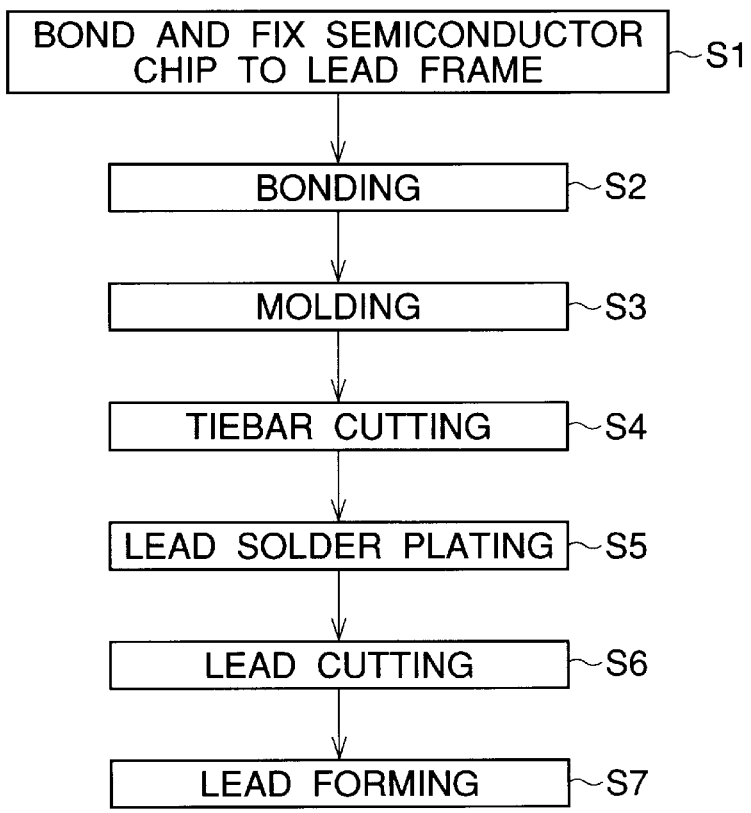
FIG. 2 is a schematic flow chart showing steps in manufacturing the resin-encapsulated semiconductor device of the present invention in order of steps.

A method of manufacturing the semiconductor device of the first embodiment will be described below. FIG. 2 is a flow chart showing steps in manufacturing the semiconductor device of the first embodiment. FIGS. 3A to 3F show schematic plan views showing the semiconductor device of the first embodiment in order of steps.

Figure 3A:
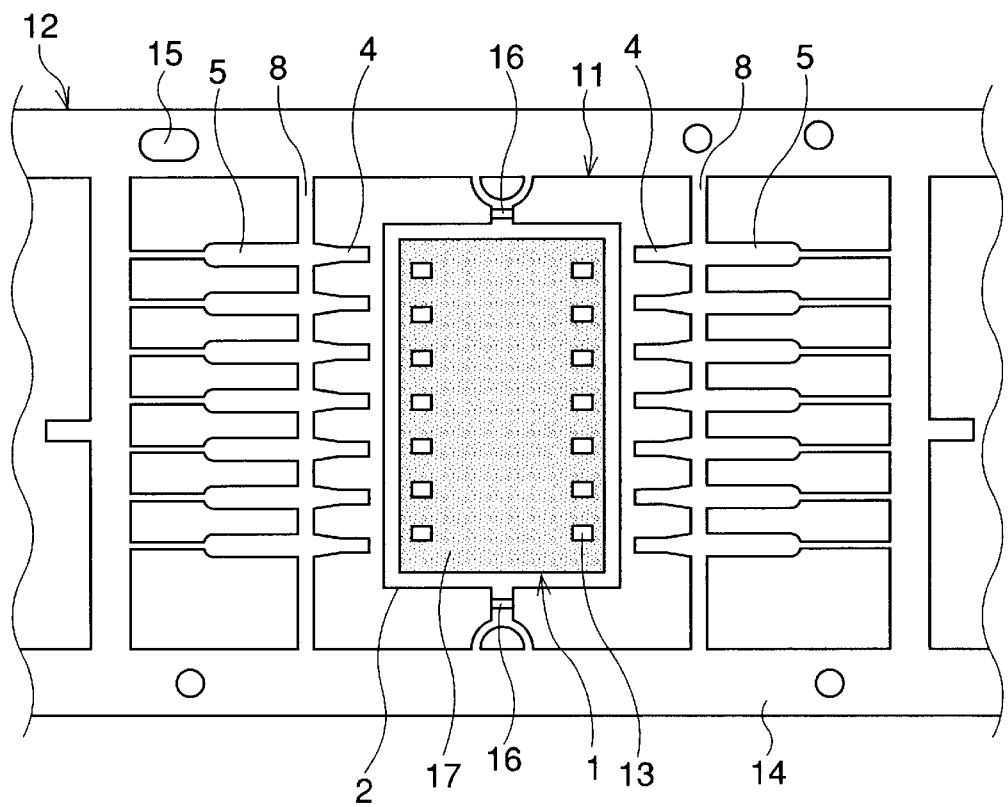
FIGS. 3A to 3F are schematic plan views for explaining steps of manufacturing the resin-encapsulated semiconductor device of the present invention.

First, as shown in FIG. 3A, the lower surface of a semiconductor chip 1 is bonded to the upper surface of a die pad 2 in a lead frame 12 including the die pad 2, inner leads 4, outer leads 5, and tiebars 8 (step S1).

Figure 3B:
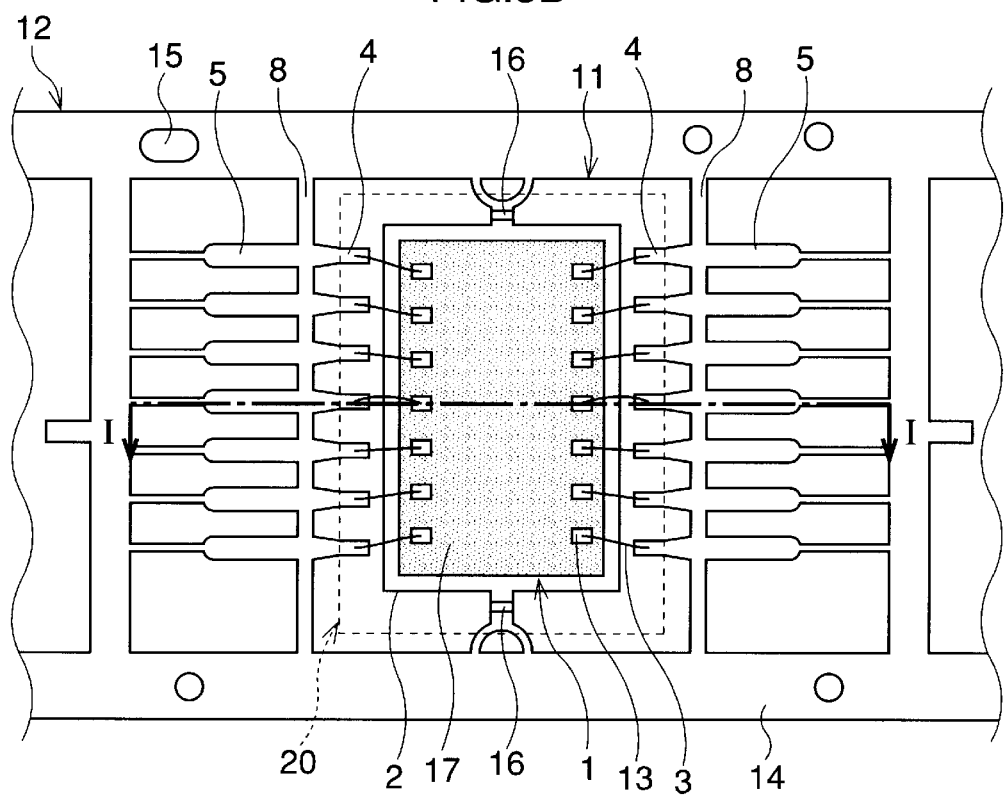

Subsequently, as shown in FIG. 3B, bonding pads 13 formed on the semiconductor chip 1 are electrically connected to the inner leads 4 by bonding wires 3 (step S2).

Figure 3C:
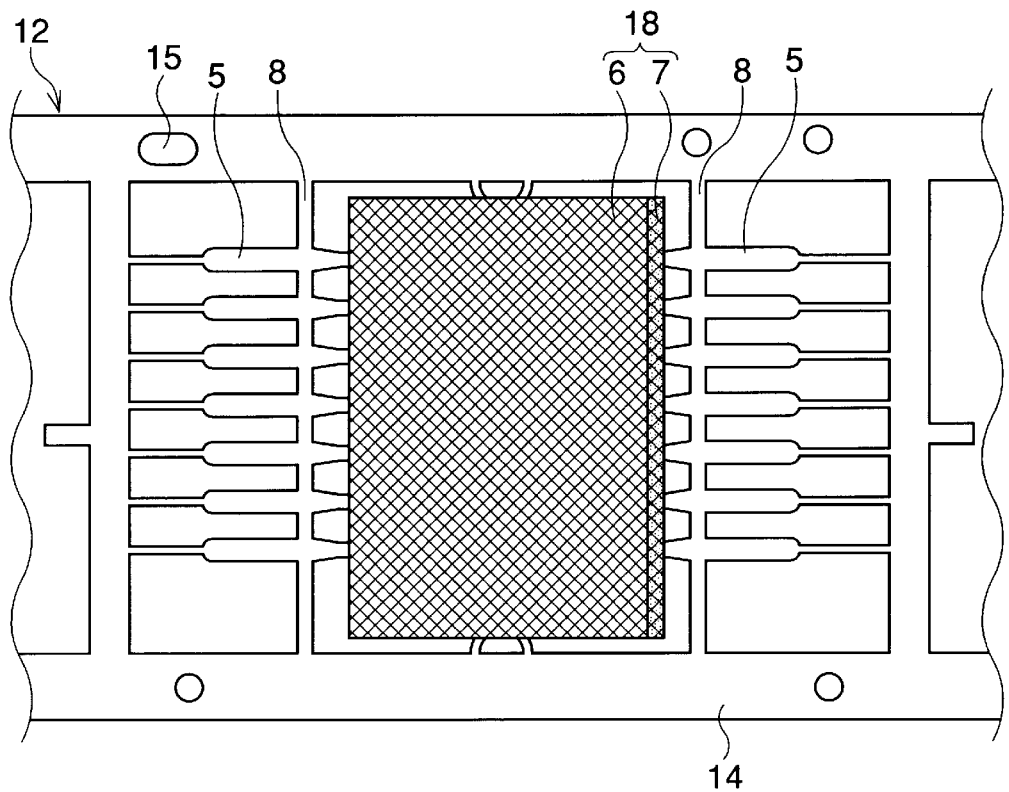

Subsequently, as shown in FIG. 3C, molding is performed by encapsulating the semiconductor chip 1 and the bonding wires 3 with an encapsulating resin 18 by transfer molding (step S3).

Before an explanation of the next step, more detailed steps in this molding step will be described below. FIGS. 4A to 4D are sectional views, taken along a line I—I in FIG. 3B, showing steps in encapsulating the semiconductor chip 1 and the bonding wires 3 with the encapsulating resin 18 in order of steps.

Figure 4A:
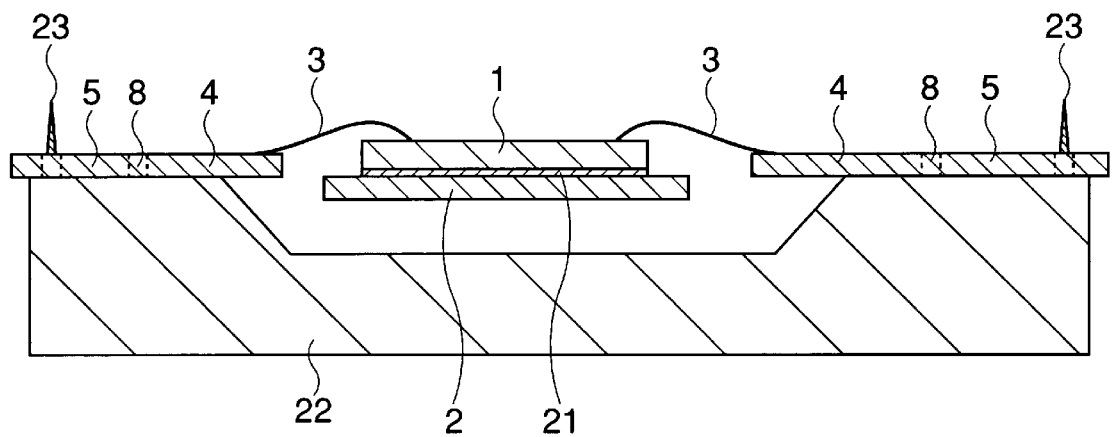
FIGS. 4A to 4D are schematic sectional views, taken along a line I—I in FIG. 3B, for explaining detailed steps in resin encapsulation of the resin-encapsulated semiconductor device of the present invention.

First, as shown in FIG. 4A, the lead frame 12 on which the semiconductor chip 1 is mounted is placed on a lower mold 22 of a molding die for resin encapsulation previously heated to about 175° C. More specifically, the lead frame 12 and the lower mold 22 are matched by fitting positioning pins 23 of the lower mold 22 into sprocket holes 15 formed in the lead frame 12. The processing accuracy of the sprocket holes 15, the positioning pins 23, and the lower mold 22 is about a few μm. The positioning margin between the sprocket hole 15 and the positioning pin 23 is about 20 to 30 μm. These values are the same as in the conventional methods.

Figure 4B:
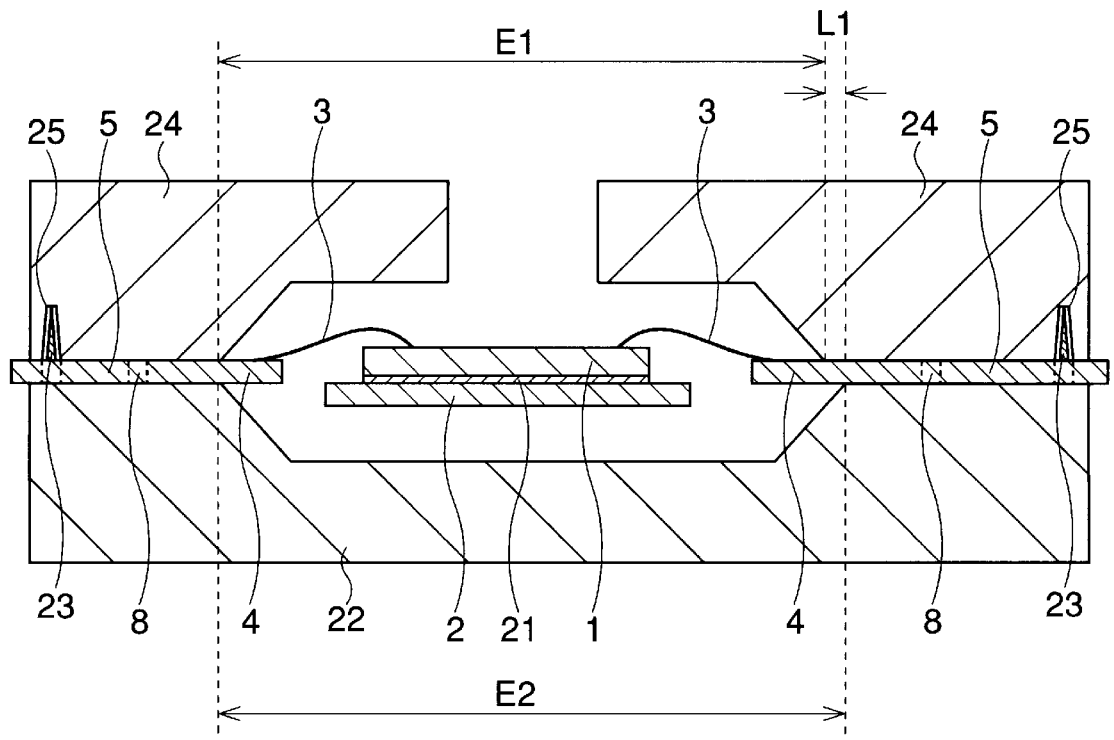

Subsequently, as shown in FIG. 4B, an upper mold 24 of the molding die for resin encapsulation is moved down from above the lead frame 12 to cover the lower mold 22, and the molding die is clamped from above and below by a predetermined pressure. In this case, the upper and lower molds 24 and 22 are matched by fitting the positioning pins 23 of the lower mold 22 into positioning recesses 25 formed in the upper mold 24. That is, the positional relation between the upper mold 24 and the lead frame 12 are not directly determined. The processing accuracy of the upper mold 24 is about a few μm. The positioning margin between the positioning pin 23 and the positioning recess 25 is about 50 μm. These values are also the same as in the conventional methods.

A distance E1 from the boundary of the inner leads 4 at one end to the boundary of the inner leads 4 at the other end in the upper mold 24 is made shorter by L1 than a distance E2 from the boundary of the inner leads 4 at one end to the boundary of the inner leads 4 at the other end in the lower mold 22. This distance L1 is set to about 50 μm which is the positioning margin between the positioning pin 23 of the lower mold 22 and the positioning recess 25 formed in the upper mold 24. In other words, this value is a maximum amount by which the position of the upper mold 24 deviates from the position of the lower mold 22. Accordingly, even if the position of the upper mold 24 deviates from the position of the lower mold 22 when the upper mold 24 is placed on the lower mold 22, it is possible to prevent the end portion of an upper-mold portion 6 of the complete package from extending longer toward the outer leads 5 than the end portion of a lower-mold portion 7 of the complete package.

In a direction parallel to the suspension pins 16, since the tiebars 8 are not formed, it is unnecessary to take a positional deviation of the package into consideration. Therefore, a distance E3 from the boundary of one suspension pin 16 to the boundary of the other suspension pin 16 in the upper mold 24 is made equal to a distance E4 from the boundary of one suspension pin 16 to the boundary of the other suspension pin 16 in the lower mold 22.

Figure 4C:
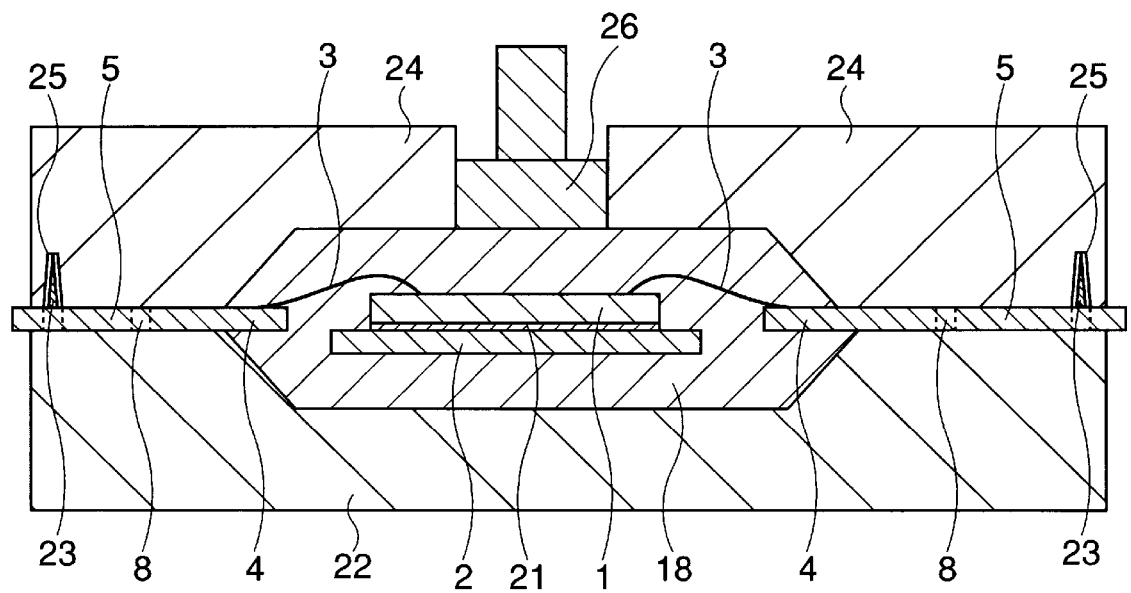

Subsequently, a resin is injected into a cavity of the molding die through an opening formed in the upper mold 24. Thereafter, as shown in FIG. 4C, the opening is closed with a plunger 26, and the encapsulating resin 18 is set in a pressure for about 2 to 3 min.

Figure 4D:
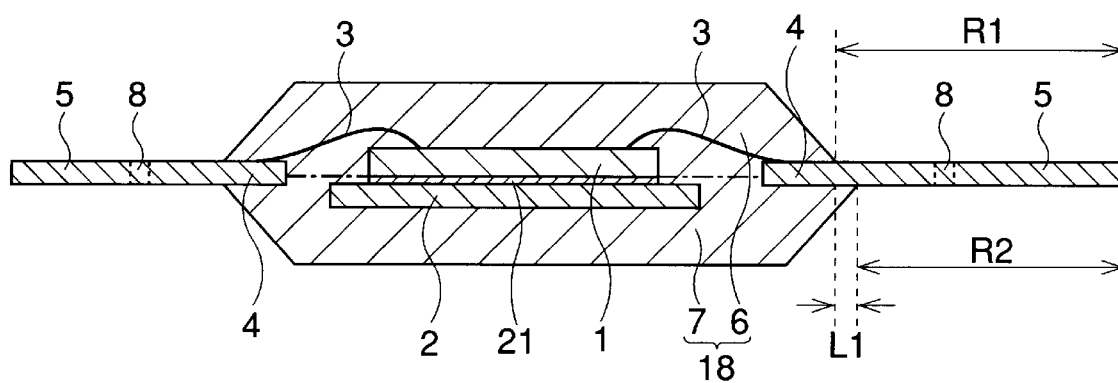

Finally, as shown in FIG. 4D, the upper and lower molds 24 and 22 and the plunger 26 are taken off the encapsulating resin 18, thereby finishing the molding. Consequently, when a maximum positional deviation occurs between the upper and lower molds 24 and 22, on one side of the encapsulating resin 18, a distance R1 from the end portion of the upper-mold portion 6 of the encapsulating resin 18 to the end portion of the outer lead 5 is not less than a distance R2 from the end portion of the lower-mold portion 7 of the encapsulating resin 18 to the end portion of the outer lead 5. Note that, in FIG. 4D, the end portions of the outer leads 5 are not strictly shown.

Figure 3D:
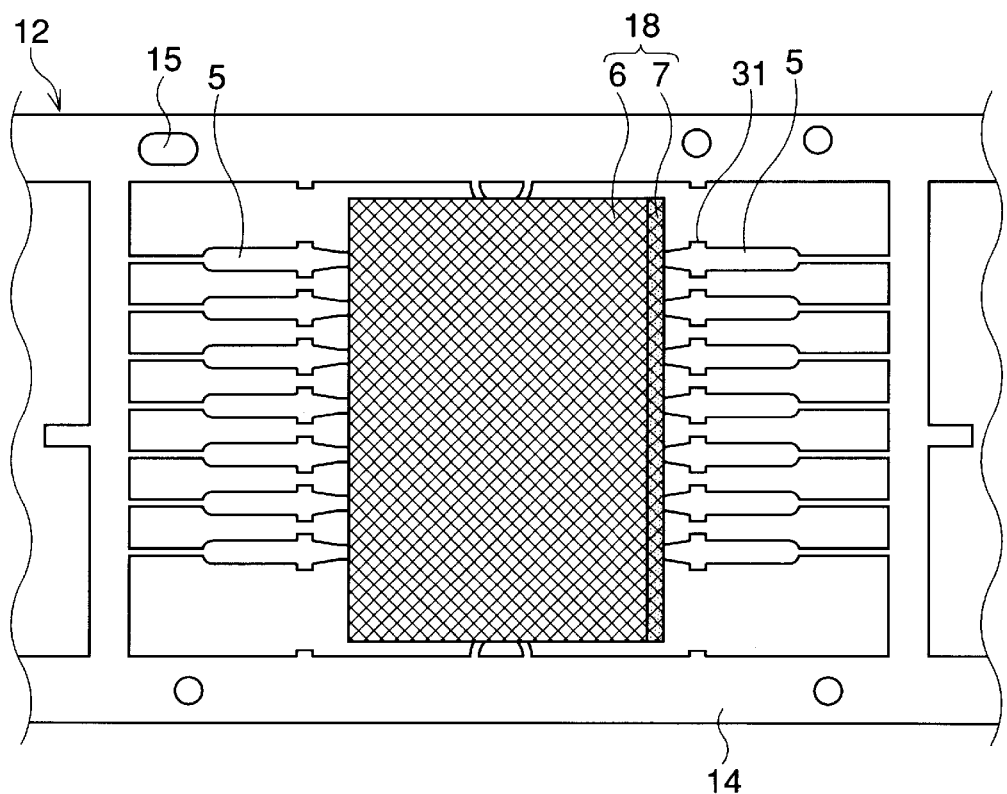

After the molding, as shown in FIG. 3D, the tiebars 8 in the lead frame 12 are cut to electrically separate the outer leads 5 (step S4). After the tiebar cutting, the tiebars 8 slightly remain as projections 31 in the boundary portions between the inner leads 4 and the outer leads 5. Depending upon the way of tiebar cutting, slight recesses may be formed in the boudary portions between the inner leads 4 and the outer leads 5.

Figure 3E:
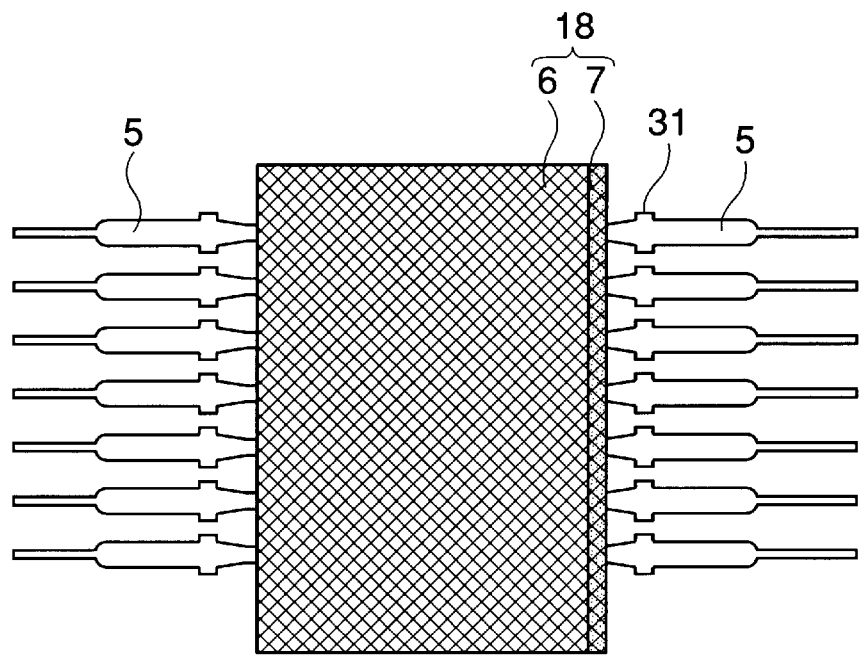

Subsequently, the outer leads 5 in the lead frame 12 are plated with solder for bonding to a printed board (step S5). Thereafter, as shown in FIG. 3E, the outer leads 5 and the suspension pins 16 are cut from the base portion 14 (step S6).

Figure 3F:
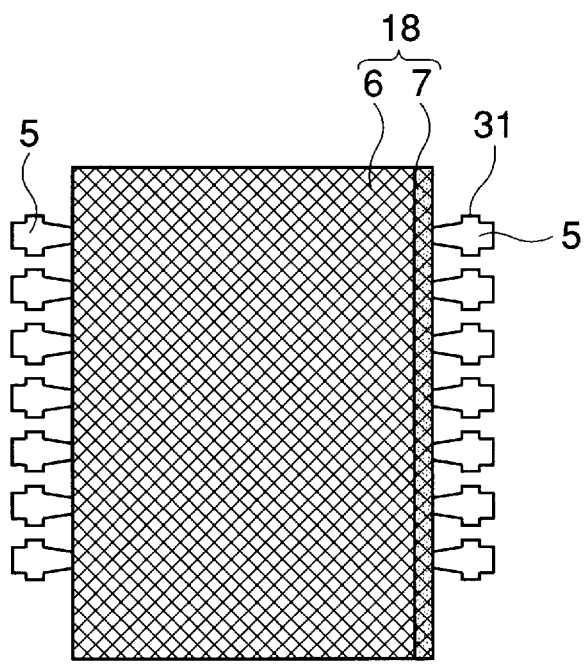

Finally, as shown FIG. 3F, the outer leads 5 are bent through approximately 90° toward the lower surface of the package to mount the package on a printed board, thereby completing the semiconductor device of the first embodiment (step S7).

As described above, the size of the upper-mold portion 6 of the encapsulating resin 18 is smaller than the size of the lower-mold portion 7 of the encapsulating resin 18, and the end portion of the upper-mold portion 6 does not extend longer toward the outer leads 5 than the end portion of the lower-mold portion 7. When the semiconductor chip 1 is encapsulated with the resin, therefore, the amount of the positional deviation between the complete package region and the prospective resin encapsulation region 20 can be decreased by about 50 μm from that in the conventional methods. Accordingly, even when the amount of the positional deviation is a maximum, a distance of at least about 70 μm is ensured as the distance L2 between the tiebars 8 and the encapsulating resin 18. Consequently, it is possible to prevent a tiebar cutting punch 9 from coming into contact with the upper-mold portion 6 in tiebar cutting and thereby prevent damage to the package and the tiebar cutting punch 9. From another point of view, since the distance between the tiebars 8 and the complete package can be decreased to about 120 μm at its longest, it is unnecessary to remove resin burr after the tiebars 8 are cut.

In the first embodiment as described above, the size of the upper-mold portion 6 is made smaller than the size of the lower-mold portion 7, so that the end portion of the upper-mold portion 6 does not extend longer toward the outer leads 5 than the end portion of the lower-mold portion 7 when the positions of the upper mold 24 and the lower mold 22 of the molding die deviate from each other in molding. That is, even when the amount of the positional deviation of the package is a maximum, it is possible to prevent the tiebar cutting punch 9 from coming into contact with the upper-mold portion 6 in tiebar cutting and thereby prevent damage to the package and the tiebar cutting punch 9. Also, it is no longer necessary to remove resin burr after the tiebars 8 are cut.

Note that an inverted package in which the size of the lower-mold portion 7 is made smaller than the size of the upper-mold portion 6 also has the above-described effect.

In the first embodiment, therefore, in a resin-encapsulated semiconductor device in which a semiconductor element is encapsulated, particularly, in a resin-encapsulated LSI package having a structure in which leads are connected by tiebars, the amount of the positional deviation between a complete package region and a prospective package region can be decreased when a semiconductor chip is encapsulated with a resin. Accordingly, even when tiebars are arranged close to a prospective resin encapsulation region in the stage of designing a lead frame, it is possible to prevent damage to the package during tiebar cutting and manufacture semiconductor devices with a stable yield. Furthermore, since the tiebars and the prospective resin encapsulation region are arranged close to each other, the amount of extension of resin burr can also be reduced. Consequently, a deflashing step of removing the resin burr is omitted, and this enables a shortening of the manufacturing process and a reduction in cost.

Second Embodiment

The second embodiment will be described below. The schematic arrangement of a semiconductor device according to the second embodiment is exactly the same as in the first embodiment explained with reference to FIGS. 1A to 1C, and only manufacturing steps are different. Therefore, a description of the arrangement of the semiconductor device will be omitted, and only a manufacturing method will be described below with reference to the accompanying drawings. Note that the components are the same as in the semiconductor device of the first embodiment, so the same reference numerals are used.

Figure 5:
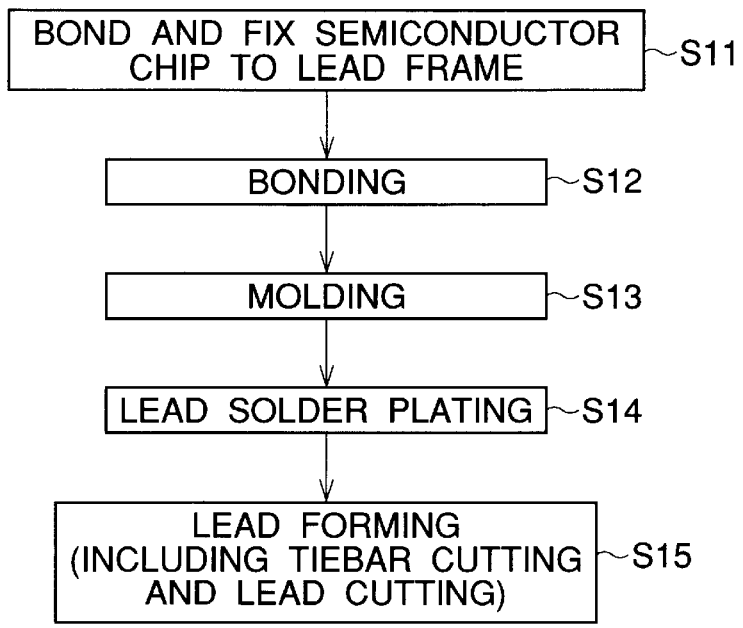
FIG. 5 is a schematic flow chart showing steps in manufacturing another resin-encapsulated semiconductor device of the present invention in order of steps.

FIG. 5 is a flow chart showing steps in manufacturing the semiconductor device of the second embodiment. FIGS. 3A to 3C and 3F show schematic plan views showing the semiconductor device of the second embodiment in order of steps.

First, as shown in FIG. 3A, the lower surface of a semiconductor chip 1 is bonded to the upper surface of a die pad 2 in a lead frame 12 including the die pad 2, inner leads 4, outer leads 5, and tiebars 8 (step S11).

Subsequently, as shown in FIG. 3B, bonding pads 13 formed on the semiconductor chip 1 are electrically connected to the inner leads 4 by bonding wires 3 (step S12).

Subsequently, as shown in FIG. 3C, molding is performed by encapsulating the semiconductor chip 1 and the bonding wires 3 with an encapsulating resin 18 by transfer molding (step S13). Since more detailed steps in this molding step are exactly the same as in the first embodiment explained with reference to FIGS. 4A to 4D, a detailed description thereof will be omitted.

After the molding, the outer leads 5 in the lead frame 12 are plated with solder for bonding to a printed board (step S14). Thereafter, as shown in FIG. 3F, the outer leads 5 and suspension pins 16 are cut from a base portion 14, and the tiebars 8 are cut to electrically separate the outer leads 5. At the same time, the outer leads 5 are bent through approximately 90° toward the lower surface of the package to mount the package on a printed board, thereby completing the semiconductor device of the second embodiment (step S15).

In the second embodiment, therefore, in a resin-encapsulated semiconductor device in which a semiconductor element is encapsulated, particularly, in a resin-encapsulated LSI package having a structure in which leads are connected by tiebars, the amount of the positional deviation between a complete package region and a prospective package region can be decreased when a semiconductor chip is encapsulated with a resin. Accordingly, even when tiebars are arranged close to a prospective resin encapsulation region in the stage of designing a lead frame, it is possible to prevent damage to the package during tiebar cutting and to manufacture semiconductor devices with a stable yield. Furthermore, since the tiebars and the prospective resin encapsulation region are arranged close to each other, the amount of extension of resin burr can also be reduced. Consequently, a deflashing step of removing the resin burr is omitted, and this enables a shortening of the manufacturing process and a reduction in cost. Additionally, since the deflashing step is omitted, lead solder plating can be performed before tiebar cutting. Consequently, it is possible to simultaneously perform the three lead processing steps, i.e., tiebar cutting, lead cutting, and lead forming, and this enables additional shortening of the process and a further reduction of the cost.

Third Embodiment

Figure 6A:
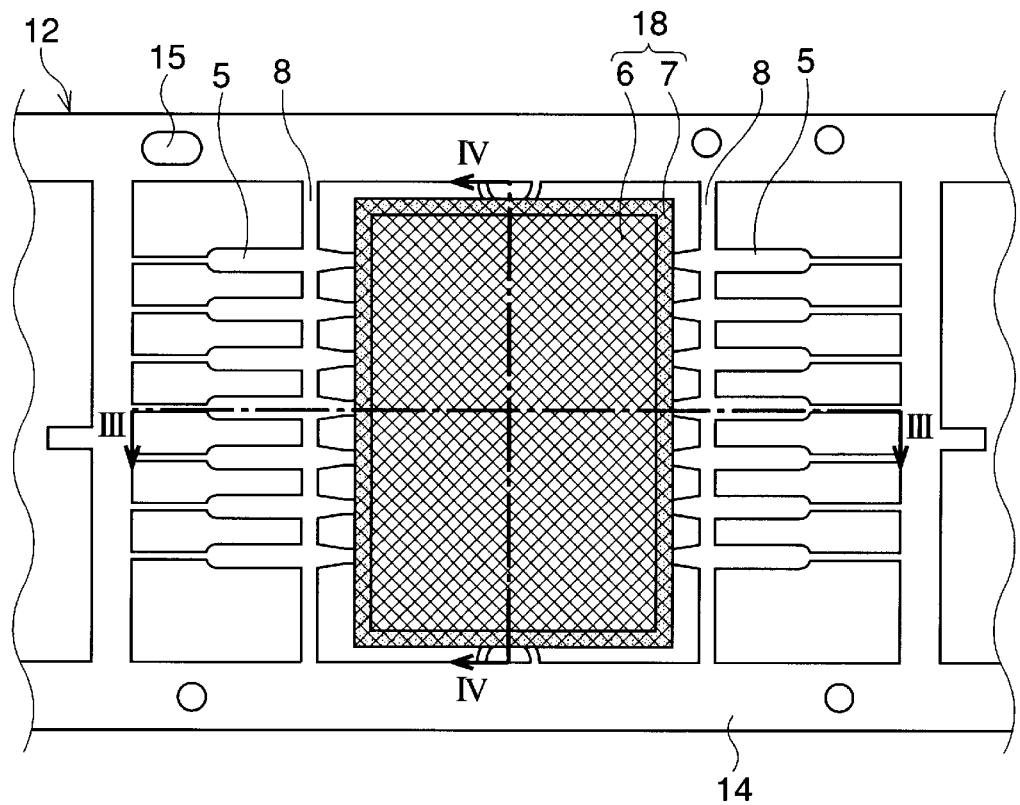
FIG. 6A is a schematic plan view showing still another resin-encapsulated semiconductor device of the present invention after resin encapsulation.
Figure 6B:
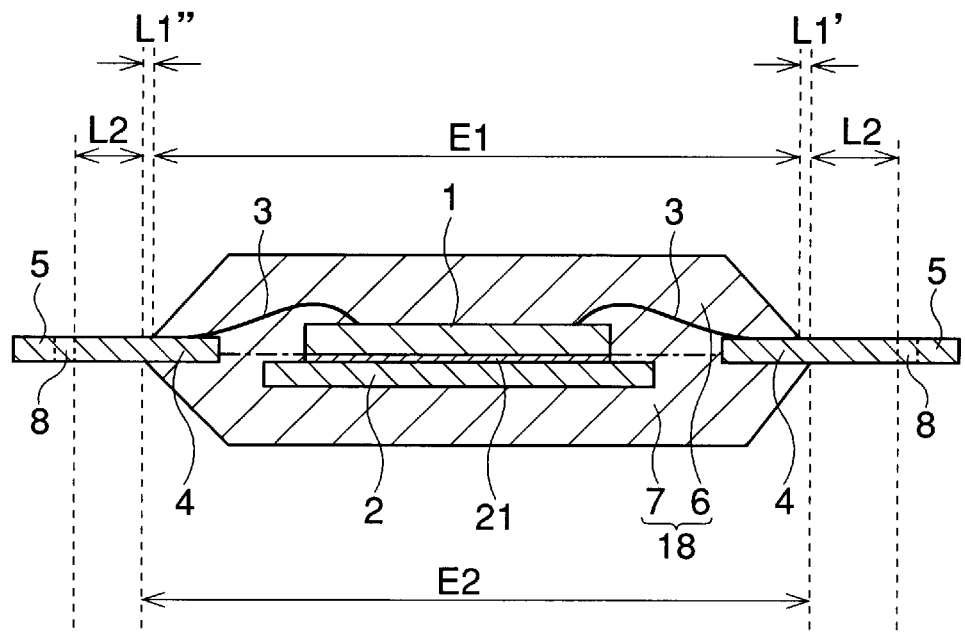
FIG. 6B is a schematic sectional view, taken along a line III—III in FIG. 6A, showing the semiconductor device after resin encapsulation.
Figure 6C:
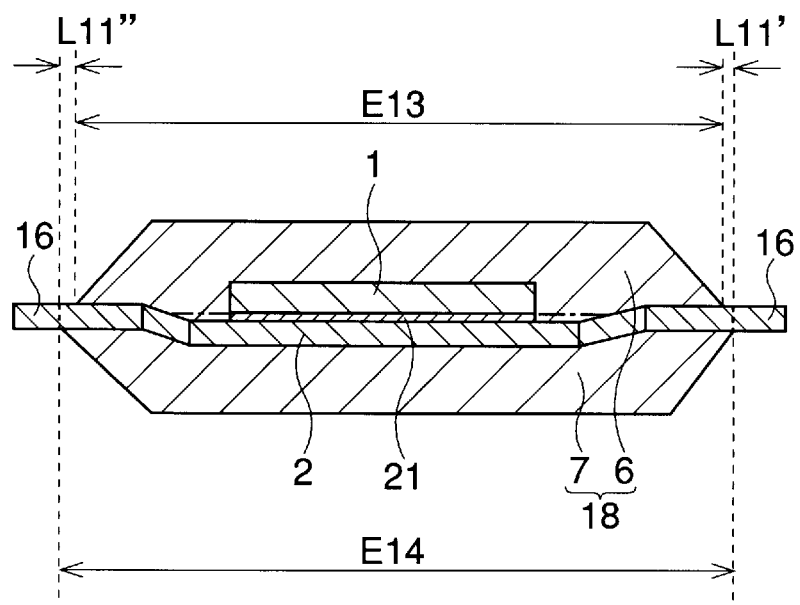
FIG. 6C is a schematic sectional view, taken along a line IV—IV in FIG. 6A, showing the semiconductor device after resin encapsulation.

The third embodiment will be described below. The schematic arrangement of a semiconductor device according to the third embodiment is almost the same as in the first embodiment explained with reference to FIGS. 1A to 1C except for the dimensions of the upper- and lower-mold portions of the encapsulation resin. In the first embodiment, the dimensions of the upper- and lower-mold portions are made different only on the sides on which no suspension pins are formed. In this embodiment, however, the dimensions of the upper- and lower-mold portions are also made different on the sides on which suspension pins are formed. FIG. 6A is a plan view schematically showing the semiconductor device of the third embodiment after resin encapsulation and before tiebar cutting. FIG. 6B is a sectional view taken along a line III—III in FIG. 6A. FIG. 6C is a sectional view taken along a line IV—IV in FIG. 6A.

Note that the components are the same as in the semiconductor device of the first embodiment, so the same reference numerals are used. The surface structure of a semiconductor chip 1 and the arrangement in a lead frame 12 in the semiconductor device of the third embodiment are the same as in the first embodiment, so a detailed description thereof will be omitted. The dimensional relation between an upper-mold portion 6 and a lower-mold portion 7, which is different from that in the first embodiment, will be described below with reference to the accompanying drawings.

Assuming that a portion of an encapsulating resin 18 on one side of the semiconductor chip 1 on which bonding wires 3 pass is the upper-mold portion 6 and a portion of the encapsulating resin 18 on the other side of the semiconductor chip 1 close to a die pad 2 is the lower-mold portion 7, as shown in FIG. 6B, a distance E1 from the boundary of the inner leads 4 at one end to the boundary of the inner leads 4 at the other end in the upper-mold portion 6 is made shorter by L1 than a distance E2 from the boundary of the inner leads 4 at one end to the boundary of the inner leads 4 at the other end in the lower-mold portion 7. Referring to FIG. 6B, L1 is the sum of L1' and L1". This distance L1 is set to a value equivalent to the amount of the positional deviation occurring when the upper and lower molds of the molding die are matched to encapsulate the semiconductor chip 1 with the resin. For example, L1 is set to about 50 µm in this embodiment.

Also, as shown in FIG. 6C, a distance E13 from the boundary of one suspension pin 16 to the boundary of the other suspension pin 16 in the upper-mold portion 6 is made shorter by L11 than a distance E14 from the boundary of one suspension pin 16 to the boundary of the other suspension pin 16 in the lower-mold portion 7. Referring to FIG. 6C, L11 is the sum of L11' and L11". This distance L11 need not be equal to the distance L1; i.e., the distance L11 only must be within the range permitted as an error between a prospective complete dimension and an actual complete dimension by a product standard. For example, when a difference of 120 µm between the prospective complete dimension and the actual complete dimension is permitted by the product standard, the distance L11 is set to about 100 µm.

A method of manufacturing the semiconductor device of the third embodiment is exactly the same as in the first embodiment, so a detailed description thereof will be omitted.

In the third embodiment, therefore, in a resin-encapsulated semiconductor device in which a semiconductor element is encapsulated, particularly, in a resin-encapsulated LSI package having a structure in which leads are connected by tiebars, the amount of the positional deviation between a complete package region and a prospective package region can be decreased when a semiconductor chip is encapsulated with a resin. Accordingly, even when tiebars are arranged close to a prospective resin encapsulation region in the stage of designing a lead frame, it is possible to prevent damage to the package during tiebar cutting and to manufacture semiconductor devices with a stable yield. Additionally, the upper-mold portion does not extend over the lower-mold portion, not only in the direction perpendicular to the tiebars, but also in the direction parallel to the suspension pins. Therefore, the complete product has a good outer appearance. Furthermore, since the tiebars and the prospective resin encapsulation region are arranged close to each other, the amount of extension of resin burr can also be reduced. Consequently, a deflashing step of removing the resin burr is omitted, and this enables a shortening of the manufacturing process and a reduction in cost.

Fourth Embodiment

Figure 7A:
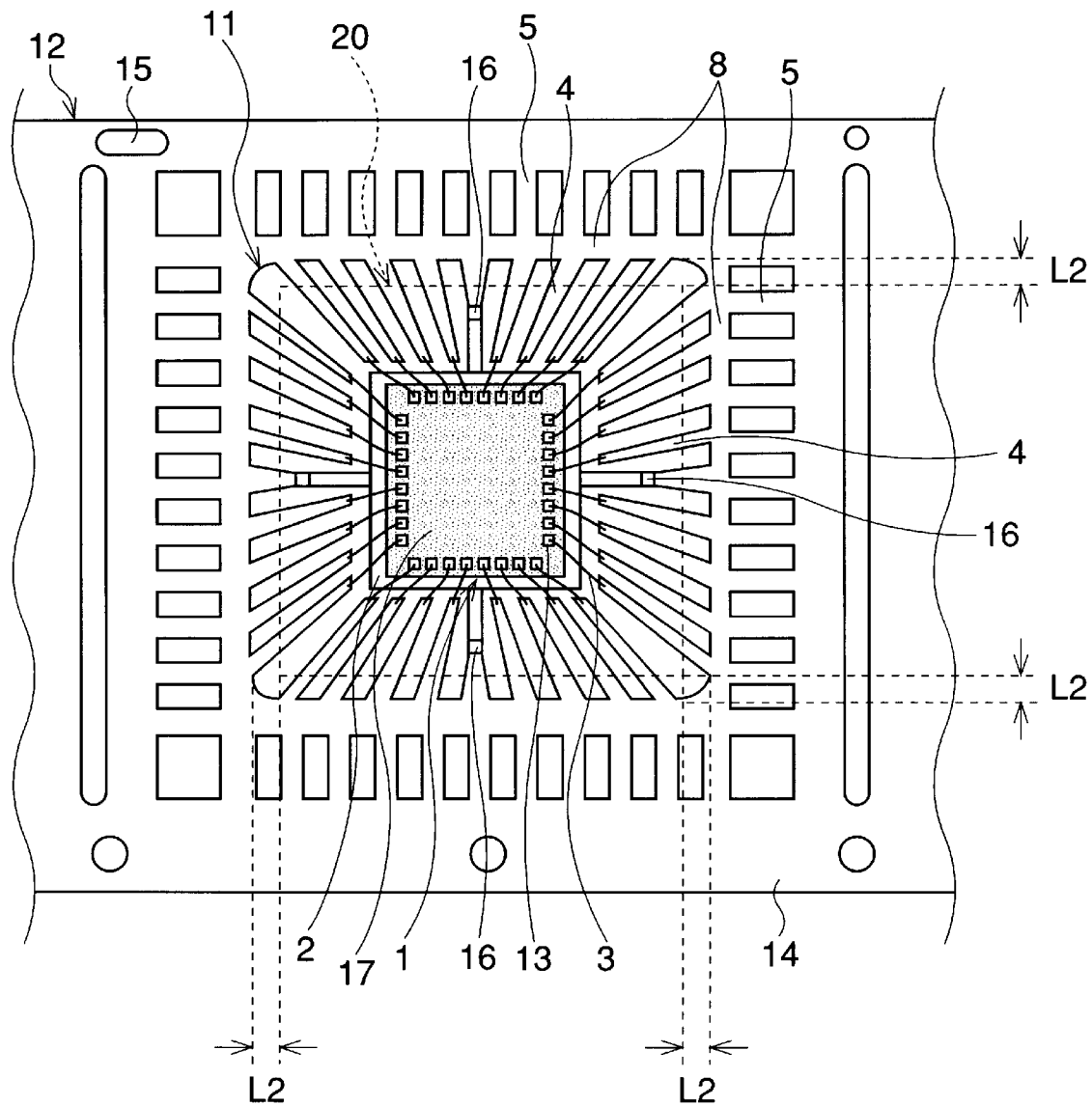
FIG. 7A is a schematic plan view showing still another resin-encapsulated semiconductor device of the present invention before resin encapsulation.
Figure 7B:
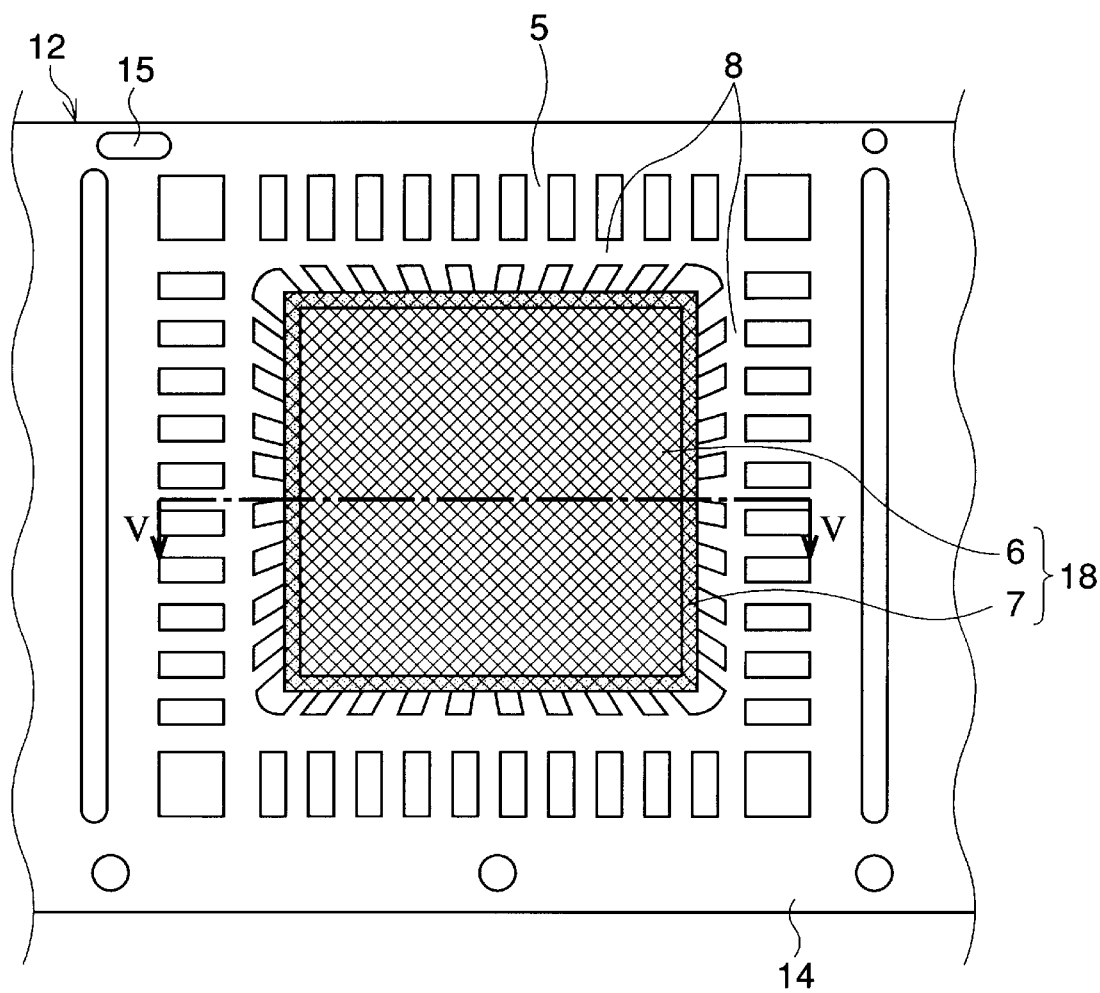
FIG. 7B is a schematic plan view showing the semiconductor device in FIG. 7A after resin encapsulation.
Figure 7C:
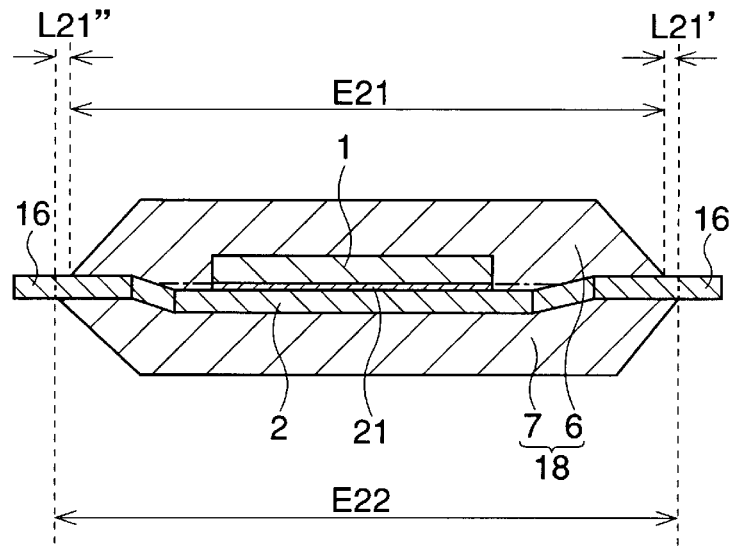
FIG. 7C is a schematic sectional view, taken along a line V—V in FIG. 7B, showing the semiconductor device after resin encapsulation.
Figure 8:
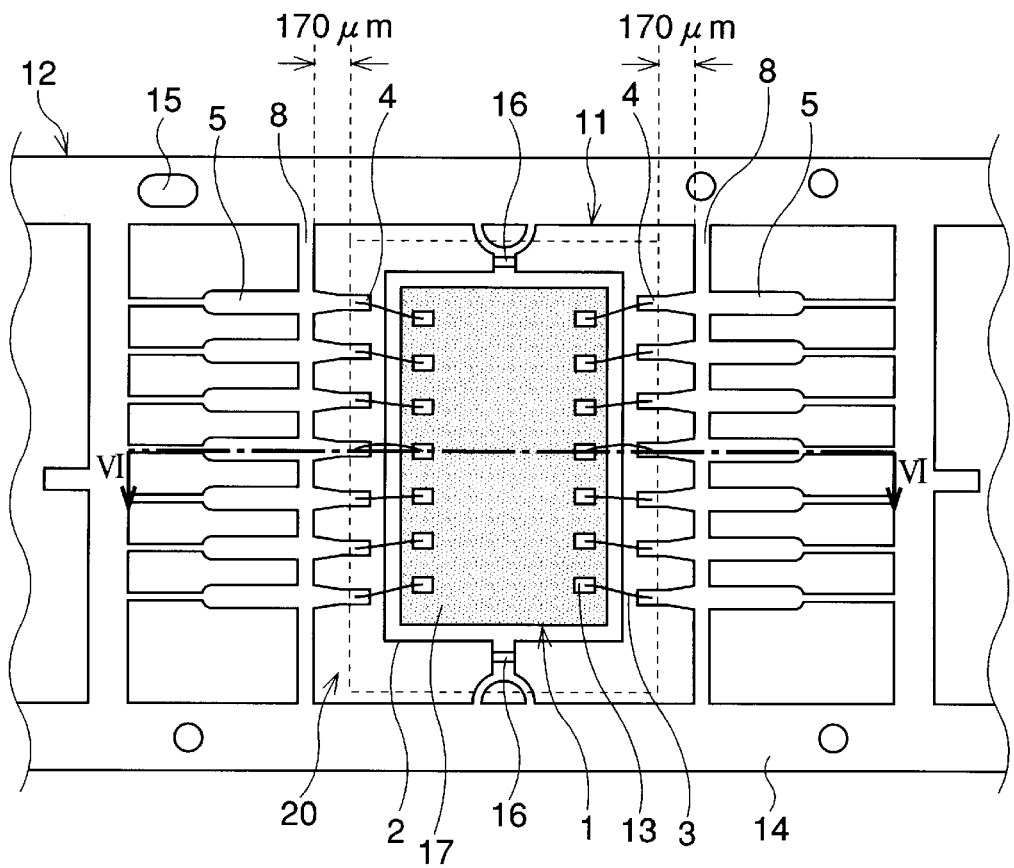
FIG. 8 is a schematic plan view showing a conventional resin-encapsulated semiconductor device before resin encapsulation.
Figure 9:
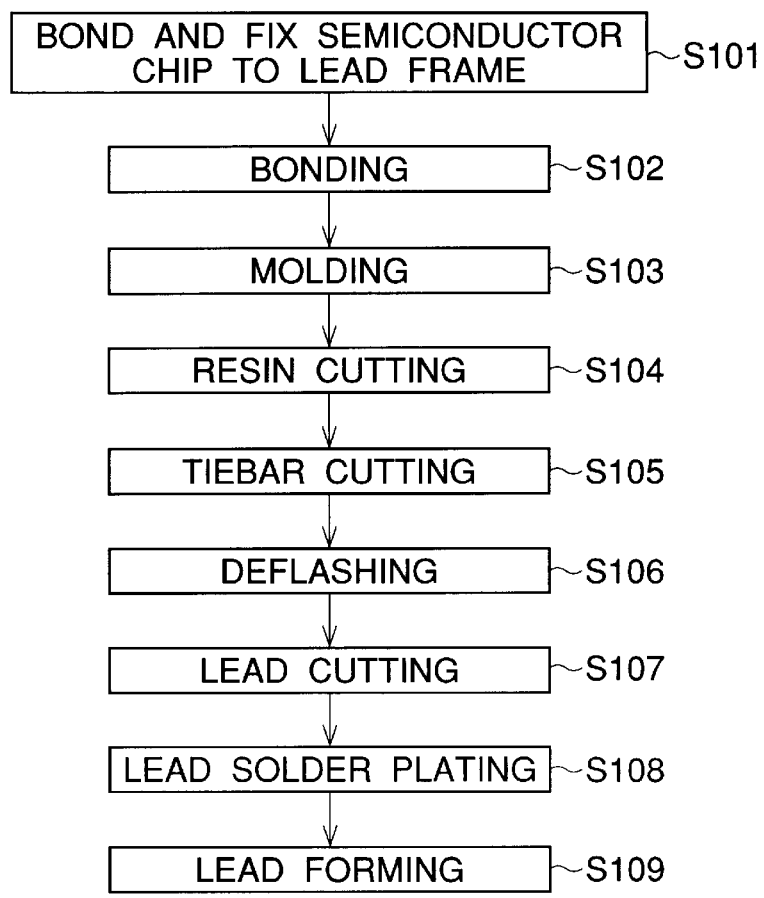
FIG. 9 is a schematic flow chart showing steps in manufacturing the conventional resin-encapsulated semiconductor device.
Figure 10A:
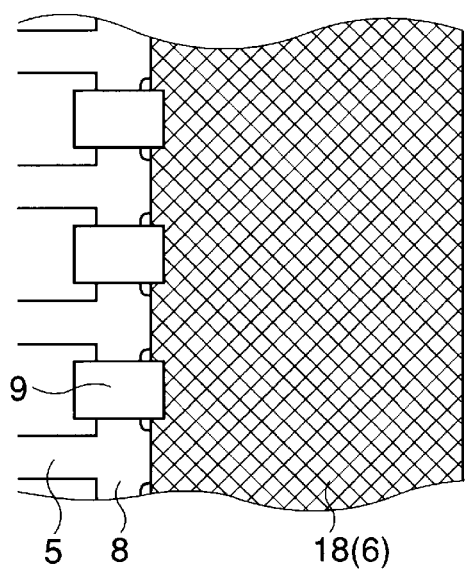
FIG. 10A is an enlarged schematic plan view showing a portion of a resin encapsulating portion and its neighborhood of the conventional resin-encapsulated semiconductor device in FIG. 8 in tiebar cutting.
Figure 10B:
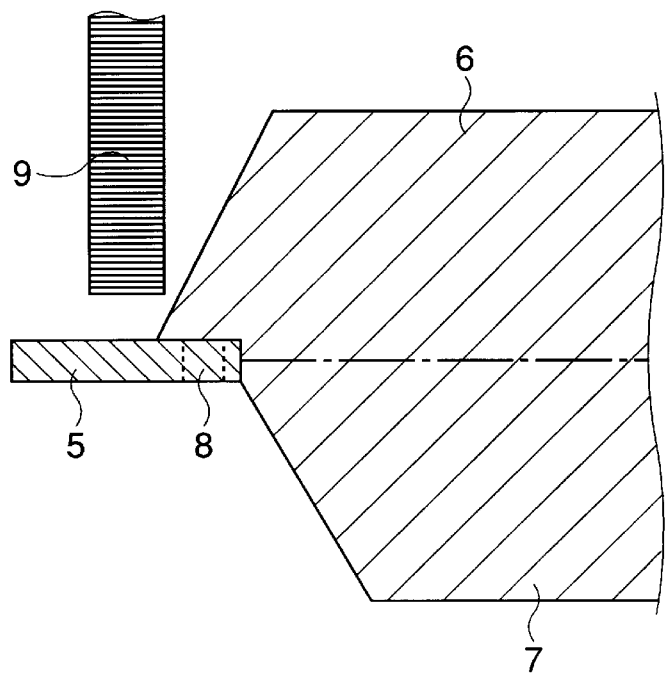
FIG. 10B is an enlarged schematic sectional view showing a portion of another resin encapsulating portion and its neighborhood of the conventional resin-encapsulated semiconductor device in FIG. 8 in tiebar cutting.
Figure 11A:
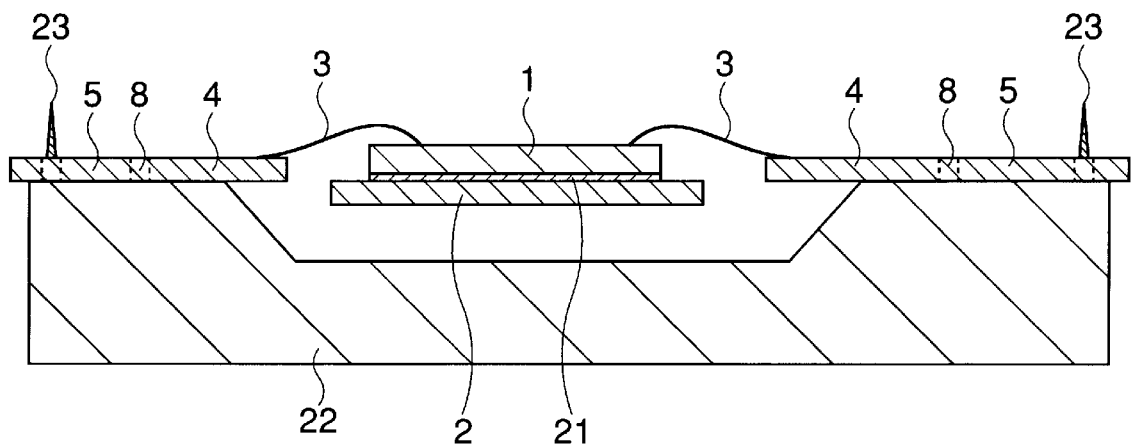
FIGS. 11A to 11D are schematic sectional views, taken along a line VI—VI in FIG. 8, for explaining detailed steps in resin encapsulation of the conventional resin-encapsulated semiconductor device.
Figure 11B:
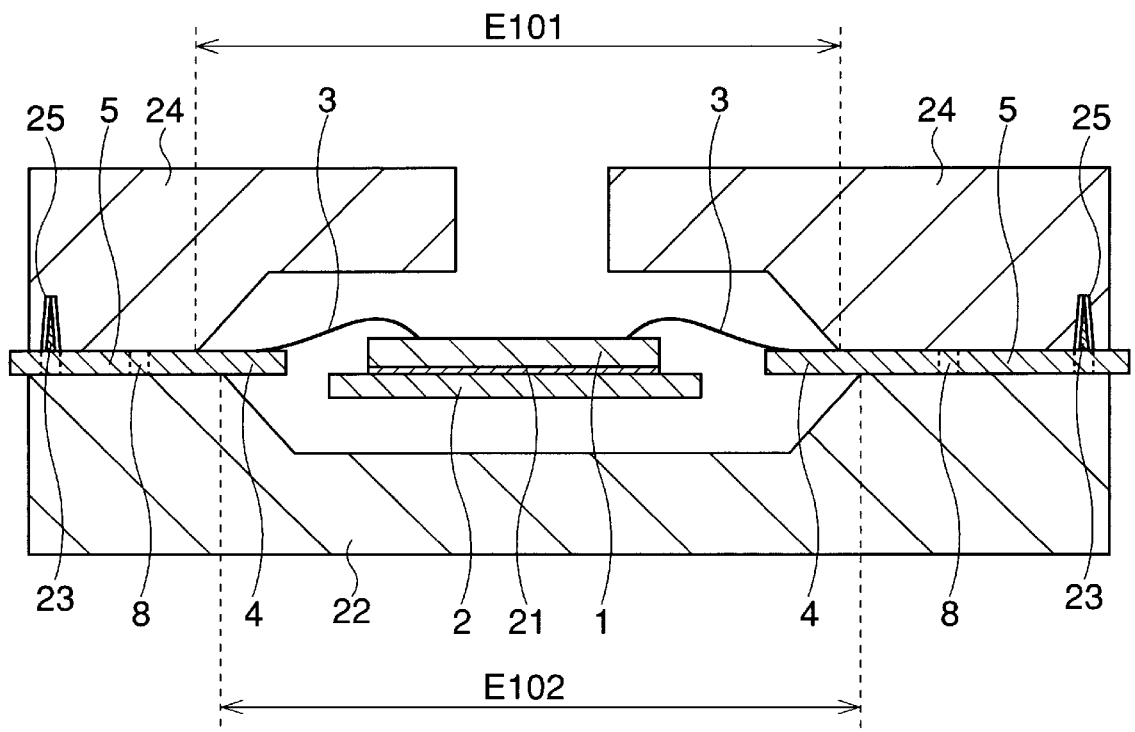
Figure 11C:
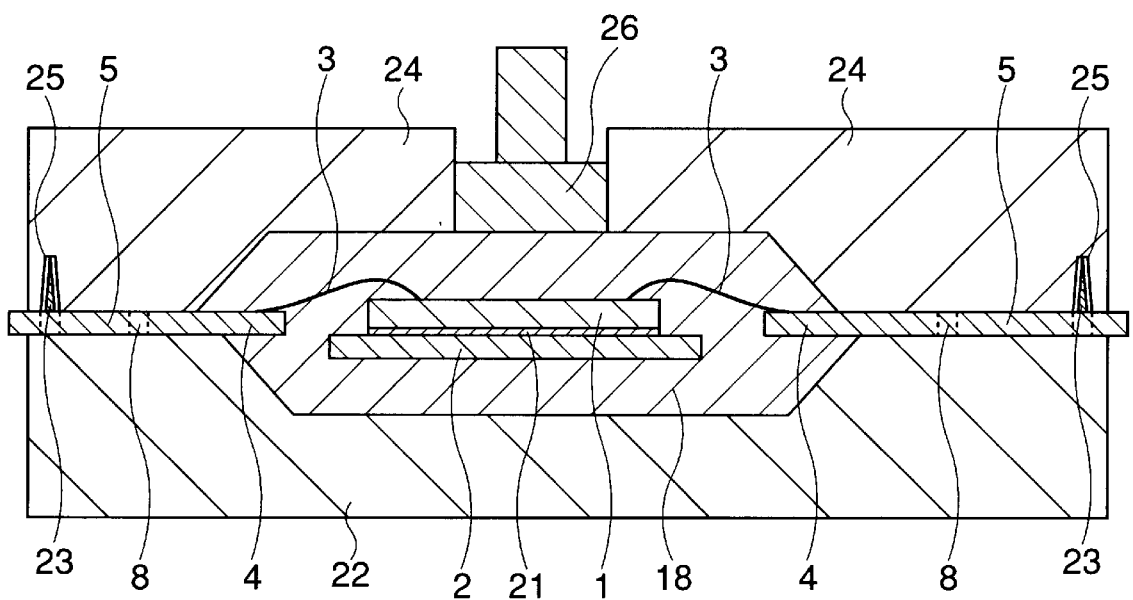
Figure 11D:
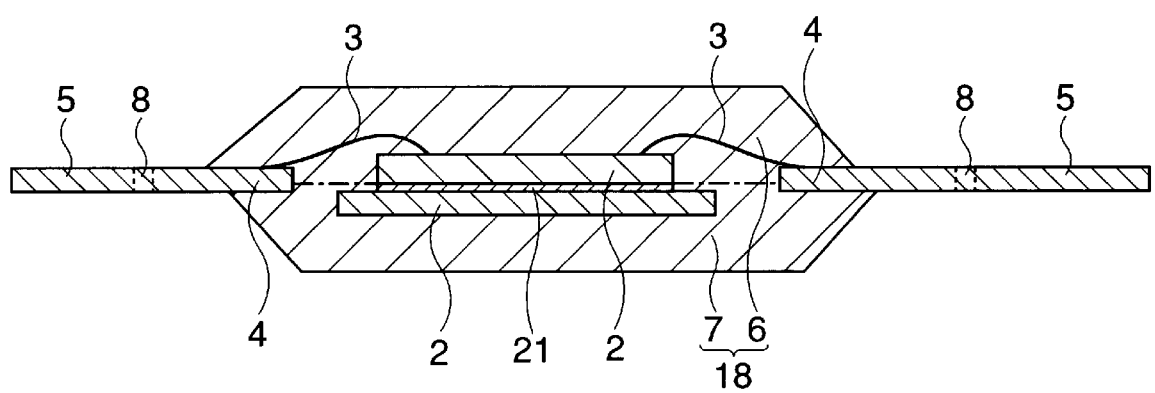

The fourth embodiment will be described below. The schematic structure of a semiconductor device according to the fourth embodiment is almost the same as in the third embodiment except for the arrangement in a lead frame 12. In the third embodiment, leads protrude only from a pair of two opposing side surfaces of the four surfaces of the package. In this embodiment, however, leads protrude from all of the four side surfaces of a package. FIG. 7A is a plan view schematically showing the semiconductor device of the fourth embodiment before resin encapsulation. FIG. 7B is a plan view schematically showing the semiconductor device in FIG. 7A after resin encapsulation and before tiebar cutting. FIG. 7C is a sectional view taken along a line V—V in FIG. 7B. A sectional view in a direction perpendicular to the line V—V in FIG. 7B is the same as FIG. 7C, so this view will be omitted.

Note that the components are the same as in the semiconductor device of the third embodiment, so the same reference numerals are used. The surface structure of a semiconductor chip 1 in the semiconductor device of the fourth embodiment is the same as in the third embodiment, so a detailed description thereof will be omitted. The arrangement in the lead frame 12, which is different from that in the third embodiment, will be described below with reference to the accompanying drawings.

As shown in FIG. 7A, a rectangular device hole 11 is formed in a substantially central portion of the lead frame 12 made of an alloy. The lead frame 12 having the device hole 11 includes inner leads 4, outer leads 5, tiebars 8, a base portion 14, and sprocket holes 15. The inner leads 4 are formed so as to project from the peripheral edge of the device hole 11 toward the device hole 11. Each of the outer leads 5 is connected to the corresponding inner lead 4. Each of the tiebars 8 is formed so as to cross the boundary portions between the inner leads 4 and the outer leads 5. The base portion 14 supports the tiebars 8. The sprocket holes 15 are formed in the base portion 14 at a predetermined interval. The distance L2 between the tiebars 8 and a prospective resin encapsulation region 20 as a package region is 120 µm, which is conventionally 170 µm.

In the device hole 11, suspension pins 16 are formed in the lead frame 13 in the central positions of the four rows of the inner leads 4 projecting from the peripheral edge of the device hole 11. The end portions of these suspension pins 16 are offset downward from the level of the lead frame 12 by about the thickness of the semiconductor chip 1. A die pad 2 for holding the semiconductor chip 1 is formed in the device hole 11 and fixed to the lead frame 12 by the four suspension pins 16. A plurality of lead frames 12 are continuously formed so as to correspond to a plurality of semiconductor chips 1. FIG. 7A shows one lead frame 12 corresponding to one semiconductor chip 1. The thickness of the lead frame 12 is normally about 0.125 mm.

The semiconductor chip 1 is fixed on the die pad 2 with a cushioning material 21 interposed therebetween. The inner leads 4 are electrically connected to the bonding pads 12 formed in arbitrary positions on the semiconductor chip 1 by bonding wires 3 made of gold (Au). The bonding wire 3 may be a copper (Cu) wire, a coated wire formed by coating the surface of a metal wire with an insulating resin, or the like.

The prospective resin encapsulation region 20 shown in FIG. 7A is filled with a resin by using a molding die, and all surfaces of the semiconductor chip 1 are covered with an encapsulating resin 18 as shown in FIGS. 7B and 7C. Assuming that a portion of the encapsulating resin 18 on one side of the semiconductor chip 1 close to the die pad 2 is a lower-mold portion 7 and a portion of the encapsulating resin 18 on the other side of the semiconductor chip 1 is an upper-mold portion 6, a distance E21 from the boundary of the inner leads 4 at one end to the boundary of the inner leads 4 at the other end in the upper-mold portion 6 is shorter by L21 than a distance E22 from the boundary of the inner leads 4 at one end to the boundary of the inner leads 4 at the other end in the lower-mold portion 7. Referring to FIG. 7C, L21 is the sum of L21' and L21''. This distance L21 is set to a value equivalent to the amount of the positional deviation occurring when the upper and lower molds of the molding die are matched to encapsulate the semiconductor chip 1 with the resin. For example, L21 is set to about 50 µm in this embodiment.

A method of manufacturing the semiconductor device of the fourth embodiment is exactly the same as in the third embodiment, so a detailed description thereof will be omitted.

In the fourth embodiment, therefore, in a resin-encapsulated semiconductor device in which a semiconductor element is encapsulated, particularly, in a resin-encapsulated LSI package having a structure in which leads are connected by tiebars, the amount of the positional deviation between a complete package region and a prospective package region can be decreased when a semiconductor chip is encapsulated with a resin. Accordingly, even when tiebars are arranged close to a prospective resin encapsulation region in the stage of designing a lead frame, it is possible to prevent damage to the package during tiebar cutting and to manufacture semiconductor devices with a stable yield. Furthermore, since the tiebars and the prospective resin encapsulation region are arranged close to each other, the amount of extension of resin burr can also be reduced. Consequently, a deflashing step of removing the resin burr is omitted, and this enables a shortening of the manufacturing process and a reduction in cost.

Fifth Embodiment

The fifth embodiment will be described below. The schematic arrangement of a semiconductor device according to the fifth embodiment is exactly the same as in the fourth embodiment explained with reference to FIGS. 7A to 7C, and only manufacturing steps are different. Therefore, a description of the arrangement of the semiconductor device will be omitted, and only a manufacturing method will be described below with reference to the accompanying drawings. Note that the components are the same as in the semiconductor device of the fourth embodiment, so the same reference numerals are used.

FIG. 5 is a flow chart showing steps in manufacturing the semiconductor device of the fifth embodiment.

First, the lower surface of a semiconductor chip 1 is bonded to the upper surface of a die pad 2 in a lead frame 12 including the die pad 2, inner leads 4, outer leads 5, and tiebars 8 (step S11).

Subsequently, bonding pads 13 formed on the semiconductor chip 1 are electrically connected to the inner leads 4 by bonding wires 3 (step S12).

Subsequently, molding is performed by encapsulating the semiconductor chip 1 and the bonding wires 3 with an encapsulating resin 18 by transfer molding (step S13).

After the molding, the outer leads 5 in the lead frame 12 are plated with solder for bonding to a printed board (step S14). Thereafter, the outer leads 5 and suspension pins 16 are cut from a base portion 14, and the tiebars 8 are cut to electrically separate the outer leads 5. At the same time, the outer leads 5 are bent through approximately 90° toward the lower surface of the package to mount the package on a printed board, thereby completing the semiconductor device of the fifth embodiment (step S15).

In the fifth embodiment, therefore, in a resin-encapsulated semiconductor device in which a semiconductor element is encapsulated, particularly, in a resin-encapsulated LSI package having a structure in which leads are connected by tiebars, the amount of the positional deviation between a complete package region and a prospective package region can be decreased when a semiconductor chip is encapsulated with a resin. Accordingly, even when tiebars are arranged close to a prospective resin encapsulation region in the stage of designing a lead frame, it is possible to prevent damage to the package during tiebar cutting and to manufacture semiconductor devices with a stable yield. Furthermore, since the tiebars and the prospective resin encapsulation region are arranged close to each other, the amount of extension of resin burr can also be reduced. Consequently, a deflashing step of removing the resin burr is omitted, and this enables a shortening of the process and a reduction in cost. Additionally, since the deflashing step is omitted, lead solder plating can be performed before tiebar cutting. Consequently, it is possible to simultaneously perform the three lead processing steps, i.e., tiebar cutting, lead cutting, and lead forming, and this enables additional shortening of the process and a further reduction of the cost.

What is claimed is:

1. A semiconductor device comprising:

a semiconductor chip;

a mold portion for encapsulating said semiconductor chip; and inner leads extending substantially parallel to a circuit formation surface of said semiconductor chip in said mold portion and protruding outward from side surfaces of said mold portion, wherein said mold portion comprises an upper-mold portion covering the circuit formation surface of said semiconductor chip and a lower-mold portion covering an opposite surface of said semiconductor chip, and a width of said upper-mold portion is smaller than a width in the same direction of said lower-mold portion and said upper and lower-mold portions are disposed so that an end face of said upper-mold portion is offset by a distance greater than 0 $\mu$m and not greater than 50 $\mu$m from an end face of said lower-mold portion on at least one side surface of said mold portion, establishing a positional deviation between the end face of the upper mold and the end face of the lower mold.

2. The device according to claim 1, wherein at least one of outer leads connected to said inner leads has at least one of a projection and a recess formed outside an end face of said lower-mold portion when tiebars, connecting said outer leads which are arranged in parallel with one another, are cut.

3. A semiconductor device comprising:

a semiconductor chip;

a mold portion for encapsulating said semiconductor chip, said mold portion having a substantially rectangular parallelepiped shape; and inner leads extending substantially parallel to a circuit formation surface of said semiconductor chip in said mold portion and protruding outward from side surfaces of said mold portion, wherein said mold portion comprises an upper-mold portion covering said circuit formation surface of said semiconductor chip and a lower-mold portion covering a surface of said semiconductor chip opposite to said circuit formation surface, the width of said upper-mold portion is smaller than the width in the same direction of said lower-mold portion on either pair of opposite side surfaces constituting four side surfaces of said mold portion, and said upper-mold portion has a first end portion and said lower-mold portion has a second end portion opposing said first end portion disposed so that a positional deviation from said first end portion of said upper-mold portion to said second end portion of said lower-mold portion is greater than 0 $\mu$m and not greater than 50 $\mu$m.

4. A resin-encapsulated semiconductor device in which a semiconductor chip is encapsulated with a resin, comprising:

inner leads arranged on a peripheral portion of said semiconductor chip, said inner leads extending parallel to a circuit formation surface of said semiconductor chip and protruding outward from side surfaces of a mold portion, said mold portion having an upper and lower end portion, wherein the distance R1 from said upper end portion of said mold portion on a surface, on which a bonding wire is bonded, of at least one of said inner leads to an outer portion of an outer lead connected to said one of said inner leads is longer than the distance R2 from the corresponding lower end portion of said mold portion on the opposite surface of said one of said inner leads to said outer portion of said outer lead, and a difference between the distances R1 and R2 is greater than 0 $\mu$m and not greater than 50 $\mu$m, establishing a positional deviation between said upper end portion and said lower end portion.

5. The device according to claim 4, wherein at least one of outer leads connected to said inner leads has at least one of a projection and a recess formed outside an end face of said mold portion on the opposite surface of said inner lead when tiebars, connecting said outer leads which are arranged in parallel with one another, are cut.

6. A semiconductor device comprising:

a semiconductor chip;

a mold portion for encapsulating said semiconductor chip; and inner leads extending substantially parallel to a circuit formation surface of said semiconductor chip in said mold portion and protruding outward from side surfaces of said mold portion, wherein said mold portion comprises an upper-mold portion covering the circuit formation surface of said semiconductor chip and a lower-mold portion covering an opposite surface of said semiconductor chip, and a width of said upper-mold portion is larger than a width in the same direction of said lower-mold portion, wherein said mold portion has a substantially rectangular parallelepiped shape, and a positional deviation from an end face of said upper-mold portion to an end face of said lower-mold portion is greater than 0 $\mu$m and not greater than 50 $\mu$m on at least one side surface of said mold portion.

7. The device according to claim 6, wherein at least one of outer leads connected to said inner leads has at least one of a projection and a recess formed outside an end face of said upper-mold portion when tiebars, connecting said outer leads which are arranged in parallel with one another, are cut.

8. A semiconductor device comprising:

a semiconductor chip;

a mold portion for encapsulating said semiconductor chip; and inner leads extending substantially parallel to a circuit formation surface of said semiconductor chip in said mold portion and protruding outward from side surfaces of said mold portion, wherein said mold portion comprises an upper-mold portion covering the circuit formation surface of said semiconductor chip and a lower-mold portion covering an opposite surface of said semiconductor chip, and a width of said upper-mold portion is larger than a width in the same direction of said lower-mold portion, and wherein said mold portion has a substantially rectangular parallelepiped shape, and the width of said upper-mold portion is larger than the width in the same direction of said lower-mold portion on two pairs of side surfaces constituting four side surfaces of said mold portion, and wherein a positional deviation from an end face of said upper-mold portion to an end face of said lower-mold portion is greater than 0 $\mu$m and not greater than 50 $\mu$m on at least one side surface of each of the two pairs of side surfaces of said mold portion.

9. A resin-encapsulated semiconductor device in which a semiconductor chip is encapsulated with a resin, comprising:

(a) inner leads arranged on a peripheral portion of said semiconductor chip, said inner leads extending parallel to a circuit formation surface of said semiconductor chip and protruding outward from side surfaces of a mold portion, wherein (b) a distance R3 from an end portion of said mold portion on a surface on which a bonding wire is bonded of at least one of said inner leads to an end portion of an outer lead connected to said inner lead is less than a distance R4 from the end portion of said mold portion on an opposite surface of said inner lead to the end portion of said outer lead, and wherein a difference between the distances R3 and R4 is not more than 50 µm, and wherein at least one of outer leads connected to said inner leads has at least one of a projection and a recess formed outside an end face of said mold portion on the surface on which the bonding wire is bonded of said inner lead when tiebars, connecting said outer leads which are arranged in parallel with one another, are cut.

10. A semiconductor device comprising:

a semiconductor chip;

a mold portion for encapsulating said semiconductor chip; and inner leads extending on a plane substantially horizontal to a surface of said semiconductor chip, an inner portion of each of said inner leads being arranged near said semiconductor chip in said mold portion and another inner portion of each of said inner leads protruding outward from side surfaces of said mold portion, wherein, when a portion of said mold portion on the upper side of the plane on which said inner leads are extending is defined as an upper-mold portion and a portion of said mold portion on the lower side of the plane on which said inner leads are extending is defined as a lower-mold portion, the maximum length of said upper-mold portion in at least one direction parallel to said inner leads is different from the maximum length of said lower-mold portion in the same direction, a difference between the maximum length of said upper-mold portion and the maximum length of said lower-mold portion is substantially equal or more than the amount of a maximum positional deviation, in the same direction, between upper and lower molds of a molding die used when said semiconductor chip is encapsulated, wherein said upper-mold portion is formed with a first end portion and said lower-mold portion is formed with a second end portion located opposite to said first end portion and offset from said first end portion, establishing a positional deviation between said first and second end portions.

11. The device according to claim 10, wherein the maximum length of said upper-mold portion is shorter by about 50 µm than the maximum length of said lower-mold portion.

12. The device according to claim 10, wherein the maximum length of said lower-mold portion is shorter by about 50 µm than the maximum length of said upper-mold portion.

* * * * *